(12) United States Patent
Lilak et al.

(10) Patent No.: US 12,051,723 B2
(45) Date of Patent: Jul. 30, 2024

(54) PN-BODY-TIED FIELD EFFECT TRANSISTORS

(71) Applicant: Intel Corporation, Santa Clara, CA (US)

(72) Inventors: Aaron D. Lilak, Beaverton, OR (US); Kerryann Marrietta Foley, Portland, OR (US); Sayed Hasan, Portland, OR (US); Patrick Morrow, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1024 days.

(21) Appl. No.: 16/719,415

(22) Filed: Dec. 18, 2019

(65) Prior Publication Data

US 2021/0193802 A1    Jun. 24, 2021

(51) Int. Cl.
*H01L 29/10* (2006.01)
*H01L 29/66* (2006.01)
*H01L 29/78* (2006.01)

(52) U.S. Cl.
CPC .... *H01L 29/1087* (2013.01); *H01L 29/66795* (2013.01); *H01L 29/785* (2013.01); *H01L 29/7851* (2013.01)

(58) Field of Classification Search
None
See application file for complete search history.

(56) References Cited

U.S. PATENT DOCUMENTS

| 10,468,503 B1 * | 11/2019 | Balakrishnan ...... H01L 29/7884 |
| 2011/0169101 A1 * | 7/2011 | Doornbos ........... H01L 29/7856 |
| | | 257/E21.409 |
| 2018/0219075 A1 | 8/2018 | Morrow et al. |
| 2018/0315838 A1 | 11/2018 | Morrow et al. |

FOREIGN PATENT DOCUMENTS

| WO | 2017052638 A1 | 3/2017 |
| WO | 2017105515 A1 | 6/2017 |

OTHER PUBLICATIONS

Ida Jiro, et al., "Super Steep Subthreshold Slope PN-Body Tied SOI FET with Ultra Low Drain Voltage down to 0.1V," 2015 IEEE International Electron Devices Meeting (IEDM), Dec. 7-9, 2015; 4 pages.

(Continued)

*Primary Examiner* — Brigitte A Paterson
(74) *Attorney, Agent, or Firm* — Akona IP PC

(57) ABSTRACT

Disclosed herein are PN-body-tied field effect transistors (PNBTFETs), as well as related devices and methods. In some embodiments, an integrated circuit (IC) structure may include: a fin including a channel region, a contact region, and an intermediate region between the contact region and the channel region, wherein the channel region includes a dopant of a first type, the intermediate region includes a dopant of a second type different from the first type, and the contact region includes a dopant of the first type; a gate that at least partially wraps around the channel region; and a conductive contact in contact with the contact region.

23 Claims, 20 Drawing Sheets

(56) References Cited

OTHER PUBLICATIONS

Mori, Takayuki, et al., "P-Channel and N-Channel Super-Steep Subthreshold Slope PN-Body Tied SOI-FET for Ultralow Power CMO," Published Oct. 16, 2018; Journal of the Electron Devices Society, vol. 6, 2018; 7 pages.
U.S. Appl. No. 16/355,195, filed Mar. 15, 2019 entitled "Backside Contacts for Semiconductor Devices," Inventor(s): Aaron D. Lilak, et al.; 52 pages.
Ueda, Daiki, et al., "Optimizing MOS-gated thyristor using voltage-based equivalent circuit model for designing steep-subthreshold-slope PN-body-tied silicon-on-insulator FET," published Mar. 2, 2018; Japanese Journal of Applied Physics 57, 04Fd06 (2018); 7 pages.

\* cited by examiner

PN-BODY-TIED FIELD EFFECT TRANSISTORS

BACKGROUND

Transistors may be characterized by a number of metrics. For example, a transistor's subthreshold slope may be indicative of the transistor's switching speed, with steeper subthreshold slops associated with greater switching speeds.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
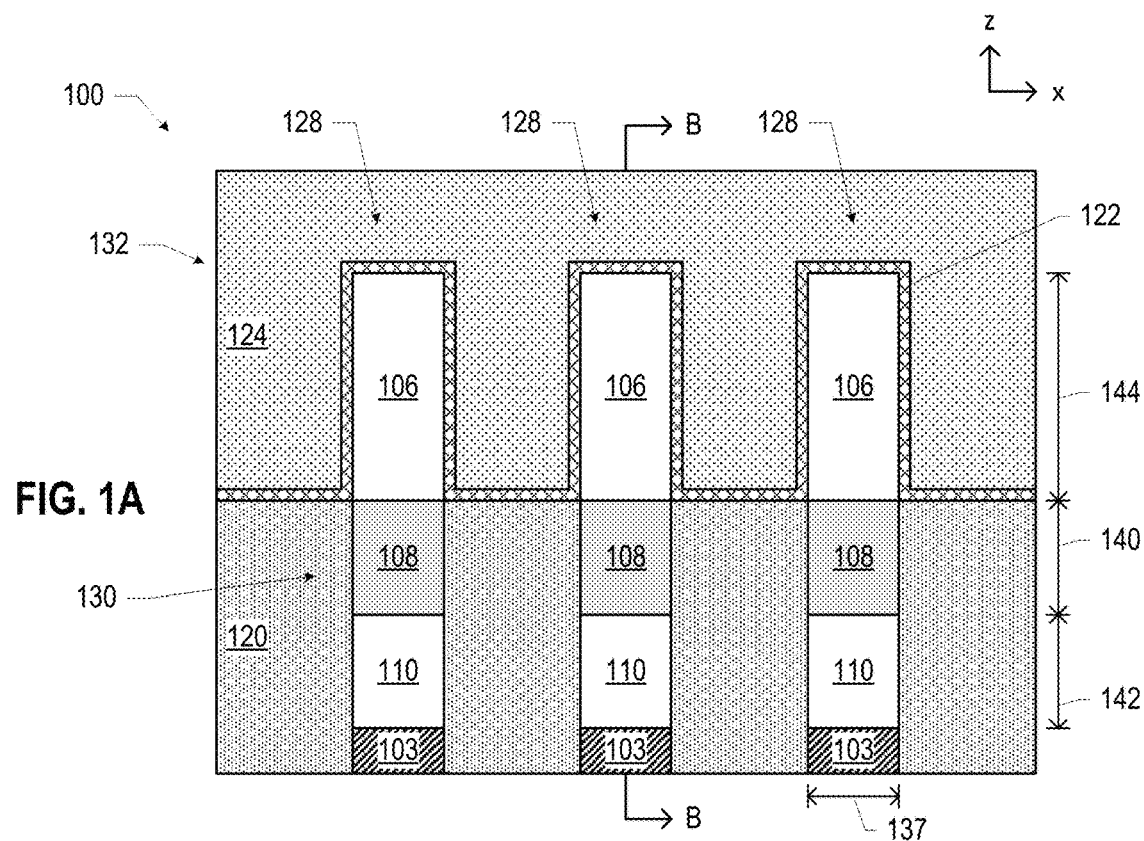
FIGS. 1A-1B are cross-sectional views of an integrated circuit (IC) structure, in accordance with various embodiments.

Disclosed herein are PN-body-tied field effect transistors (PNBTFETs), as well as related devices and methods. In some embodiments, an integrated circuit (IC) structure may include: a fin including a channel region, a contact region, and an intermediate region between the contact region and the channel region, wherein the channel region includes a dopant of a first type, the intermediate region includes a dopant of a second type different from the first type, and the contact region includes a dopant of the first type; a gate that at least partially wraps around the channel region; and a conductive contact in contact with the contact region.

The PNBTFETs disclosed herein may exhibit a steeper subthreshold slope than some conventional transistors, and may be readily manufactured using high volume manufacturing (HVM) techniques. Previous PNBTFET structures have been largely planar with a large footprint, and have utilized expensive materials and manufacturing operations, limiting the adoption of PNBTFETs in commercial devices.

The PNBTFETs and related methods and devices disclosed herein may enable the efficient and cost-effective manufacture of PNBTFETs in IC devices, allowing such devices to achieve greater switching speeds and/or reduce their power consumption. The use of the PNBTFETs disclosed herein may be particularly advantageous in low power, mobile settings, such as wearable and handheld communications devices.

In the n-type metal oxide semiconductor (NMOS) implementations of the PNBTFETs disclosed herein, a subthreshold slope that is smaller than 50 millivolts per decade may be achieved when the floating contact region supplies extra holes to the channel region, leading to further reduction of the source-to-drain conduction band barrier without additional change in the gate voltage. At low gate voltages, the voltage at the body contact may largely control the junction between the contact region and the intermediate region, with an increasing voltage forward biasing the junction. As the gate voltage increases, the result may be increased current flow between source and drain, and at a particular gate voltage, the junction between the channel region and the intermediate region may become reverse biased and may sweep holes through bipolar junction transistor (BJT) action. The accumulation of holes in the channel region may enhance the injection efficiency of the source to the channel, providing a very steep slope (e.g., smaller than 60 millivolts per decade in some embodiments) for a specific gate voltage range. Leakage current through the body contact may be small compared to the on-current of the PNBTFET, and can be reduced by doping choices made in the intermediate region and the contact region (the "PN-body-tied region") and by selection of the bias at the body contact. The body bias may also be modified to achieve higher-performing (but potentially leakier) PNBTFETs; the adjustment of body bias may be performed at device runtime, giving the PNBTFET dynamically adjustable performance capability. p-type metal oxide semiconductor (PMOS) implementations of the PNBTFETs disclosed herein may operate analogously.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 2" may be used to refer to the collection of drawings of FIGS. 2A-2B, etc.

Figure 1B:
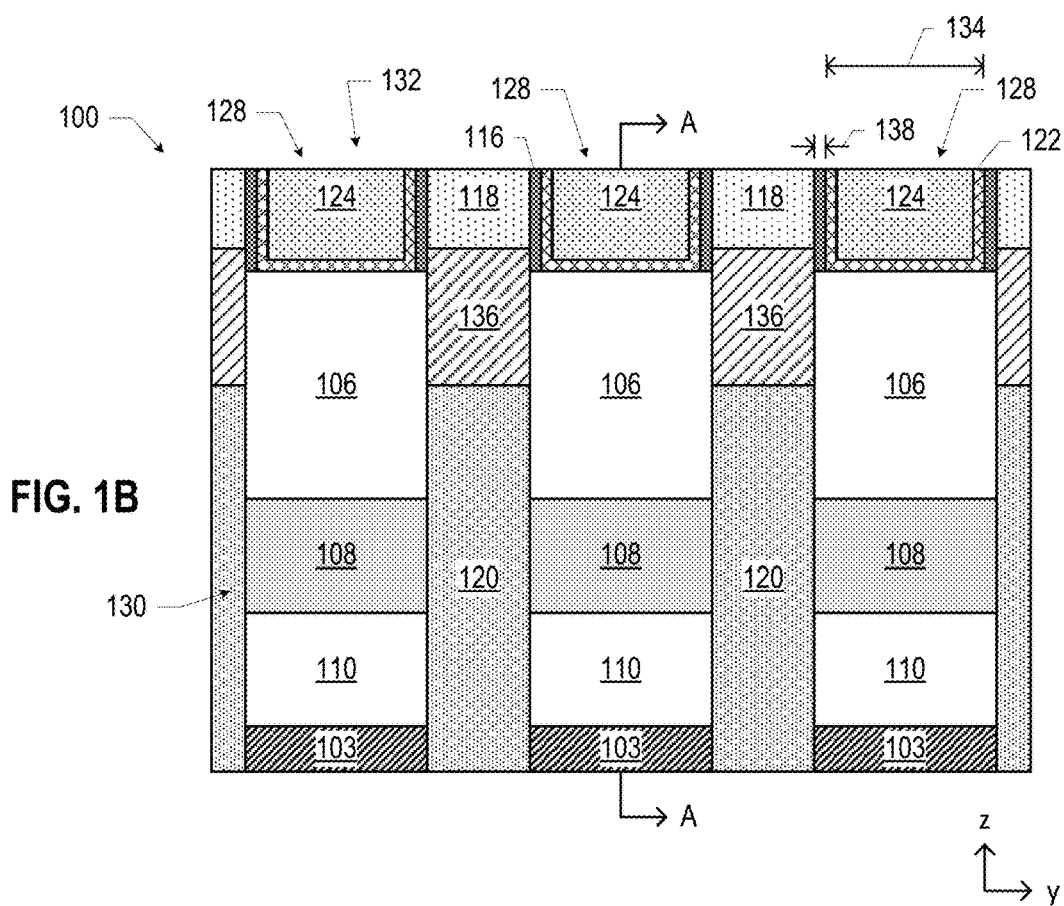
Figure 2A:
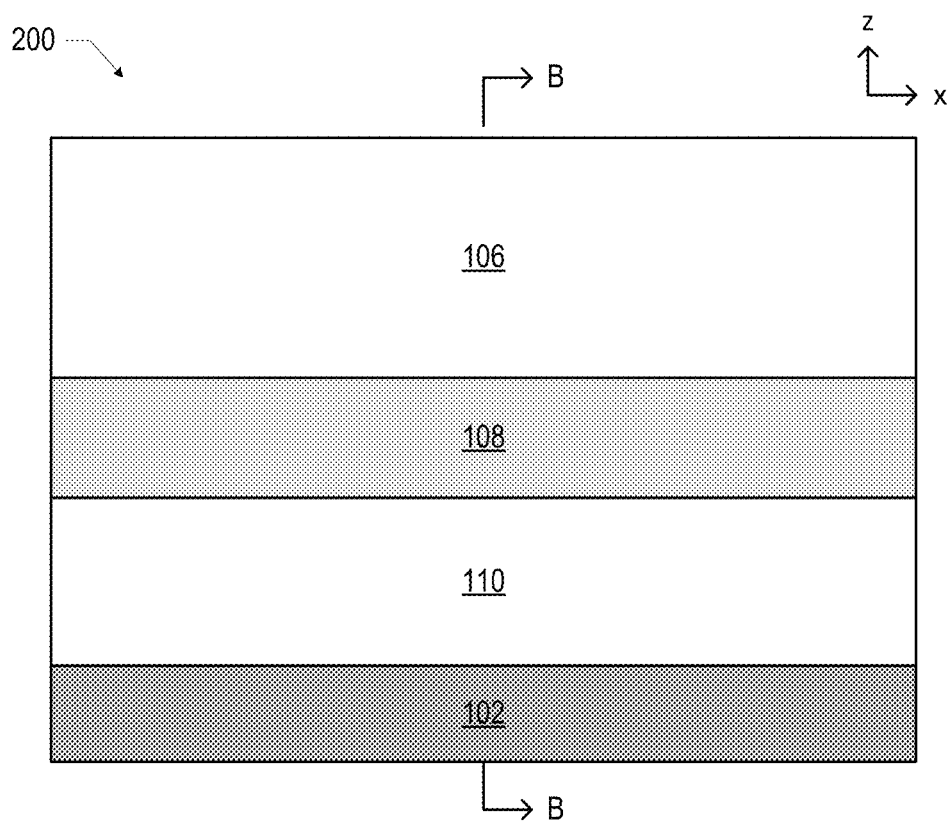
FIGS. 2A-2B, 3A-3B, 4A-4B, 5A-5B, 6A-6B, 7A-7B, 8A-8B, 9A-9B, 10A-10B, 11A-11B, 12A-12B, 13A-13B, 14A-14B, and 15A-15B are cross-sectional views of stages in an example process of manufacturing the IC structure of FIG. 1, in accordance with various embodiments.
Figure 2B:
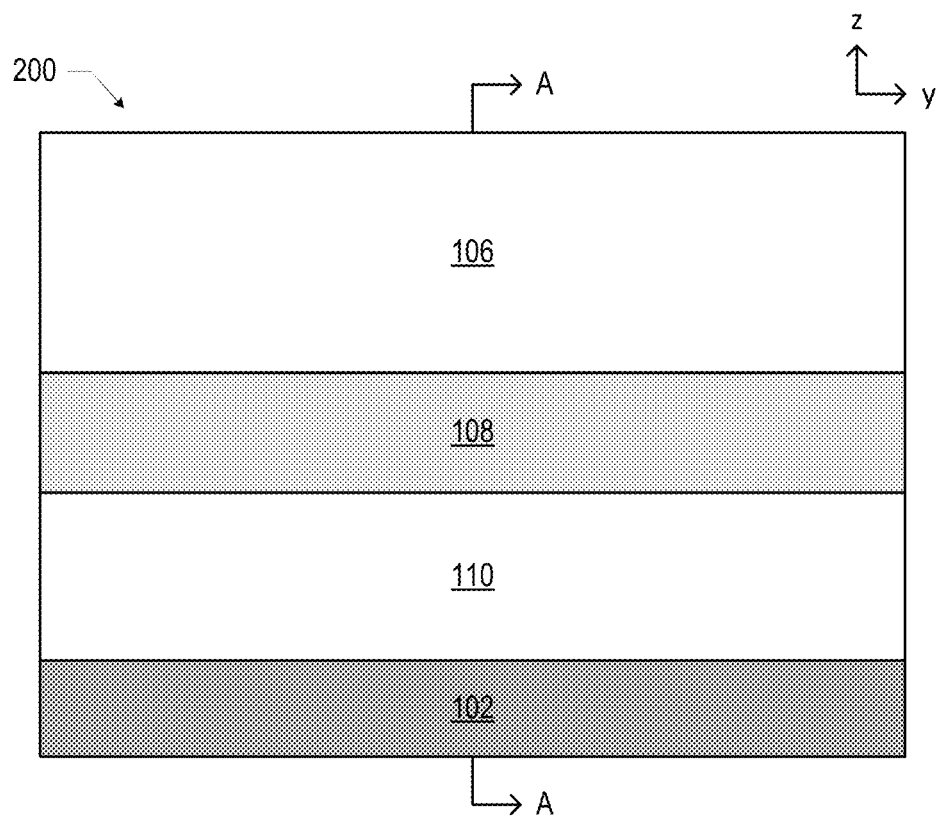

FIG. 1 illustrates an IC structure 100; FIG. 1A is a cross-sectional view through the section A-A of FIG. 1B, and FIG. 1B is a cross-sectional view through the section B-B of FIG. 1A. In particular, FIG. 1A is a cross-sectional view taken across multiple PNBTFETs 128 in the x-z plane (perpendicular to the longitudinal axes of multiple parallel fins 130), and FIG. 1B is a cross-sectional view taken along PNBTFET 128 in the x-y plane (along the longitudinal axes of multiple parallel fins 130). All of the "A" and "B" sub-figures in the accompanying drawings share the perspective of the cross-sectional views of FIGS. 1A and 1B, respectively.

The IC structure 100 includes one or more PNBTFETs 128. Although various ones of the accompanying drawings depict a particular number of PNBTFETs 128, this is simply for ease of illustration, and an IC structure 100 may include more or fewer PNBTFETs 128. Further, although various ones of the accompanying drawings depict a same doping pattern for the channel region 106, the intermediate region 108, and the contact region 110 for all of the illustrated PNBTFETs 128, an IC structure 100 may include PNBTFETs having different doping patterns (e.g., some PNBTFETs 128 having a p-type channel region 106, an n-type intermediate region 108, and a p-type contact region 110, and some PNBTFETs 128 having an n-type channel region 106, a p-type intermediate region 108, and an n-type contact region 110, as discussed further below).

Each PNBTFET 128 may include a fin 130 that includes a channel region 106, a contact region 110, and an intermediate region 108 between the channel region 106 and the contact region 110. The fin 130 has a longitudinal axis that extends into the page from the perspective of FIG. 1A and left-right from the perspective of FIG. 1B, and the channel region 106, intermediate region 108, and contact region 110 may be stacked "vertically" within the fin 130. The channel region 106, the intermediate region 108, and the contact region 110 may each include a semiconductor material and one or more dopants. The channel region 106 and the intermediate region 108 may have opposite doping types. For example, the channel region 106 may include a p-type dopant and the intermediate region 108 may include an n-type dopant; in some such embodiments, the channel region 106 may have a p-minus doping level (e.g., with a dopant density that is between 1e16 per cubic centimeter and 5e18 per cubic centimeter) and the intermediate region may have an n-minus doping level (e.g., with a dopant density that is less than 5e18 per cubic centimeter). In another example, the channel region 106 may include an n-type dopant and the intermediate region 108 may include a p-type dopant; in some such embodiments, the channel region 106 may have an n-minus doping level (e.g., with a dopant density that is less than 5e18 per cubic centimeter) and the intermediate region 108 may have a p-minus doping level (e.g., with a dopant density that is between 1e16 per cubic centimeter and 5e18 per cubic centimeter). The intermediate region 108 and the contact region 110 may have opposite doping types (and thus the channel region 106 and the contact region 110 may have the same doping type). For example, the contact region 110 may include a p-type dopant and the intermediate region 108 may include an n-type dopant; in some such embodiments, the contact region 110 may have a p-plus doping level (e.g., with a dopant density that is greater than 1e18 per cubic centimeter) and the intermediate region 108 may have an n-minus doping level (e.g., with a dopant density that is less than 5e18 per cubic centimeter). In another example, the contact region 110 may include an n-type dopant and the intermediate region 108 may include a p-type dopant; in some such embodiments, the contact region 110 may have an n-plus doping level (e.g., with a dopant density that is less than 1e18 per cubic centimeter) and the intermediate region may have a p-minus doping level (e.g., with a dopant density that is between 1e16 per cubic centimeter and 5e18 per cubic centimeter). In some embodiments of the PNBTFETs 128 disclosed herein, the doping level of the contact region 110 may exceed the doping level of the channel region 106 by two or more orders of magnitude.

The semiconductor included in the channel region 106, the intermediate region 108, and the contact region 110 may be any suitable material or materials, such as silicon and/or germanium and/or alloys of silicon and germanium and/or alloys of silicon and germanium and tin and carbon, indium antimonide, lead telluride, indium arsenide, indium phosphide, gallium arsenide, or gallium antimonide, or further materials classified as group II-VI, III-V, or IV. In some embodiments, the channel region 106, the intermediate region 108, and/or the contact region 110 may include a semiconducting oxide (e.g., indium gallium zinc oxide). Although FIG. 1 and others of the accompanying figures depict a strict line of demarcation between the channel region 106, the intermediate region 108, and the contact region 110, this is simply for ease of illustration, and in practice, the materials of these regions may interdiffuse to some extent and/or the boundaries between these different regions may be graded (e.g., when transitioning from an n-type region to a p-type region or from a p-type region to an n-type region). Further, within the channel region 106 (or the intermediate region 108 or the contact region 110), the material composition may not be uniform; for example, doping may be graded or otherwise non-uniform within a region. A body contact 103 may be disposed at the bottom of the fin 130, in contact with the contact region 110. The body contact 103 may include any suitable material(s) (e.g., one or more metals or electrically conductive metal-containing compounds such as titanium nitride) and may allow electrical contact to be made to the contact region 110 from the "backside" of the PNBTFET 128.

Source/drain (S/D) regions 136 may be in electrical contact with the longitudinal ends of the channel region 106 in a PNBTFET 128, allowing current to flow from one portion of S/D region 136 to another portion of S/D region 136 through the channel region 106 upon application of appropriate electrical potentials to the S/D region 136 through the S/D contacts 118 during operation. The S/D regions 136 of adjacent PNBTFETs 128 may be shared along fins 130 sharing a longitudinal axis, as illustrated in FIG. 1B and others of the accompanying drawings, or may be isolated from each other by an insulating material (not shown) such as silicon dioxide, silicon nitride, silicon carbide, silicon oxynitride, a polymer, or any suitable combination of these materials. Generally, the S/D regions 136 of adjacent PNBTFETs 128 may be selectively electrically coupled or isolated to achieve a desired electrical connectivity among the PNBTFETs 128.

The S/D regions 136 of a PNBTFET 128 may include dopants of a type that is opposite to a type of dopant included in the channel region 106; if the channel region 106 includes p-type dopants, the S/D regions 136 may include n-type dopants, and vice versa. In some embodiments, the S/D regions 136 may include a silicon alloy such as silicon germanium or silicon carbide. In some embodiments, S/D regions 136 may include dopants such as boron, arsenic, or phosphorous. In some embodiments, the S/D regions 136 may include one or more alternate semiconductor materials such as germanium or a group III-V material or alloy. When the S/D regions 136 include p-type dopants, the S/D regions 136 may include, for example, group IV semiconductor materials such as silicon, germanium, silicon germanium, germanium tin, or silicon germanium alloyed with carbon; example p-type dopants in silicon, silicon germanium, and germanium include boron, gallium, indium, and aluminum. A PNBTFET 128 is said to be a PMOS transistor when the S/D regions 136 include p-type dopants. When the S/D regions 136 include n-type dopants, the S/D regions 136 may include, for example, group III-V semiconductor materials such as indiumaluminum, arsenic, phosphorous, gallium, and antimony, with some example compounds including indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. When the S/D regions 136 include n-type dopants, the S/D regions 136 may include, for example, group IV semiconductor materials such as silicon, silicon germanium, germanium tin, or silicon germanium alloyed with carbon; example n-type dopants in silicon, silicon germanium, and germanium include antimony, arsenic, and phosphorus. A PNBTFET 128 is said to be an NMOS transistor when the S/D regions 136 include n-type dopants. The S/D contacts 118 may be in electrical contact with the respectively S/D regions 136, and may include any suitable material (e.g., one or more metals, such as copper, tungsten, ruthenium, cobalt, titanium, aluminum, or other metals or alloys of multiple metals or metal nitrides such as titanium nitride). In some embodiments, the S/D regions 136 may be formed by epitaxial growth on the channel region 106, as discussed below with reference to FIG. 9, and thus may have a crystalline structure patterned on the crystalline structure of the channel region 106.

In a PNBTFET 128, a gate 132 may at least partially surround the channel region 106, with the electrical impedance of the channel region 106 modulated by the electrical potential applied to the associated gate 132 (through gate contacts, not shown). A gate 132 may include a gate dielectric 122 and a gate stack 124. The gates 132 of adjacent PNBTFETs 128 may be shared among different fins 130, as illustrated in FIG. 1A and others of the accompanying drawings, or may be isolated from each other by an insulating material (not shown) such as silicon dioxide, silicon nitride, silicon carbide, silicon oxynitride, a polymer, or any suitable combination of these materials. Generally, the gates 132 of adjacent PNBTFETs 128 may be selectively electrically coupled or isolated to achieve a desired electrical connectivity among the PNBTFETs 128.

The gate dielectric 122 may contact the channel region 106. In some embodiments, the gate dielectric 122 may partially surround the channel region 106 (e.g., may be in contact with top and side surfaces of the channel region 106 at the "top" of the fin 130, as shown). The gate dielectric 122 may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 122 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 122 to improve its quality when a high-k material is used.

The gate dielectric 122 may be disposed between the channel region 106 and the gate stack 124. In some embodiments, the gate stack 124 may partially surround the channel region 106 (e.g., may be spaced apart from top and side surfaces of the channel region 106 at the "top" of the fin 130 by the gate dielectric 122, as shown). The gate stack 124 may include at least one p-type work function metal or n-type work function metal, depending on whether the PNBTFET 128 of which it is a part is to be a PMOS or an NMOS transistor. In some implementations, the gate stack 124 may consist of a stack of two or more metal layers, where one or more metal layers are work function metal layers and at least one metal layer is a fill metal layer. Further metal layers may be included for other purposes, such as a barrier layer (e.g., tantalum, tantalum nitride, an aluminum-containing alloy, etc.). In some embodiments, a gate stack 124 may include a resistance-reducing cap layer (e.g., copper, gold, cobalt, or tungsten). For a PMOS transistor, metals that may be used for the gate stack 124 include, but are not limited to, ruthenium, palladium, platinum, cobalt, nickel, conductive metal oxides (e.g., ruthenium oxide), and any of the metals discussed herein with reference to an NMOS transistor (e.g., for work function tuning). For an NMOS transistor, metals that may be used for the gate stack 124 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate stack 124 may include grading (increasing or decreasing) of the concentration of one or more materials therein. The term "gate stack" should not be interpreted to require any particular number or arrangement of materials; the gate stack 124 may include any number and arrangement of materials such that the gate stack 124 in conjunction with the gate dielectric 122 provides a gate 132. Spacers 116 may separate the gate stack 124 from the proximate S/D contacts 118 and the S/D regions 136. The spacers 116 may include silicon nitride, silicon oxide, silicon carbide, silicon nitride doped with carbon, or silicon oxynitride, for example.

A dielectric material 120 may be disposed around the base of the fins 130, proximate to the intermediate region 108 and the contact region 110. The dielectric material 120 may include any suitable insulating material, such as such as silicon dioxide, silicon nitride, silicon carbide, silicon oxynitride, a polymer, or any suitable combination of these materials. As noted above, in some embodiments, the dielectric material 120 may extend in the z-direction between adjacent PNBTFETs 128 arrayed in the x-direction to isolate the gates 132 of different PNBTFETs 128, and/or may extend in the z-direction between adjacent PNBTFETs 128 arrayed in the y-direction to isolate the S/D regions 136 and S/D contacts 118 of different PNBTFETs 128, as desired. The dielectric material 120 may not have a uniform material composition, and may be made up of different dielectric materials or combination of dielectric materials in different portions of the IC structure 100 (e.g., as discussed below with reference to FIG. 12).

The dimensions of the elements of the IC structure 100 may take any suitable values. In some embodiments, the width 137 of the fin 130 may be between 5 nanometers and 30 nanometers (e.g., between 5 nanometers and 15 nanometers). Note that, as discussed below with reference to FIG. 18, the width 137 of the fin 130 may be non-uniform along its height. In some embodiments, the height 144 of the channel region 106 may be less than 100 nanometers. In some embodiments, the height 140 of the intermediate region 108 may be between 20 nanometers and 100 nanometers (e.g., between 20 nanometers and 50 nanometers). In some embodiments, the height 142 of the contact region 110 may be between 20 nanometers and 100 nanometers (e.g., between 20 nanometers and 50 nanometers). In some embodiments, the thickness 138 of the spacers 116 may be between 6 nanometers and 12 nanometers. In some embodiments, the length 134 of the gate 132 may be between 10 nanometers and 50 nanometers (e.g., between 15 nanometers and 30 nanometers). In some embodiments, the dimensions of the PNBTFETs 128 may depend upon the circuits in which the PNBTFETs 128 are included; for example, a relatively thicker gate dielectric 122 may be used for a high voltage transistor, while a relatively thinner gate dielectric may be used for a logic transistor.

In some embodiments, the IC structure 100 may be part of a memory device, and PNBTFETs 128 of the IC structure 100 may store information in the IC structure 100 or facilitate access to (e.g., read and/or write) storage elements of the memory device. In some embodiments, the IC structure 100 may be part of a processing device. In some embodiments, the IC structure 100 may be part of a device that includes memory and logic devices (e.g., in a single die 1502, as discussed below), such as a processor and cache. More generally, the IC structures 100 disclosed herein may be part of memory devices, logic devices, or both.

FIGS. 2-15 illustrate stages in an example process for manufacturing the IC structure 100 of FIG. 1. Although the operations of the process may be illustrated with reference to particular embodiments of the IC structures 100 disclosed herein, the process of FIGS. 2-15 and variants thereof may be used to form any suitable IC structure 100 (e.g., the IC structures 100 illustrated in FIGS. 16-18). Operations are illustrated a particular number of times and in a particular order in FIGS. 2-15, but the operations may be reordered and/or repeated as desired (e.g., with different operations performed in parallel when manufacturing multiple IC structures 100 simultaneously).

FIG. 2 illustrates an assembly 200 including a base 102 and a stack of material layers on a base 102. The stack of material layers includes, starting from the base 102, a material layer corresponding to the contact region 110, a material layer corresponding to the intermediate region 108, and a material layer corresponding to the channel region 106. The height and arrangement of the material layers in the assembly 200 corresponds to the desired size and arrangement of the corresponding regions in the IC structure 100, as will be discussed further below. The assembly 200 may be formed using any suitable deposition techniques, such an epitaxial process.

The base 102 may be a semiconductor substrate composed of semiconductor material systems including, for example, n-type or p-type materials systems (or a combination of both). The base 102 may include, for example, a bulk silicon crystalline substrate. The base 102 may include a layer of silicon dioxide on a bulk silicon or gallium arsenide substrate. The base 102 may include a converted layer (e.g., a silicon layer that has been converted to silicon dioxide during an oxygen-based annealing process). In some embodiments, the base 102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the base 102. Although a few examples of materials from which the base 102 may be formed are described here, any material or structure that may serve as a foundation for an IC structure 100 may be used. The base 102 may be part of a singulated die (e.g., the dies 1502 of FIG. 19) or a wafer (e.g., the wafer 1500 of FIG. 19). In some embodiments, the base 102 may itself include an interconnect layer, an insulation layer, a passivation layer, an etch stop layer, additional device layers, etc.

Figure 3A:
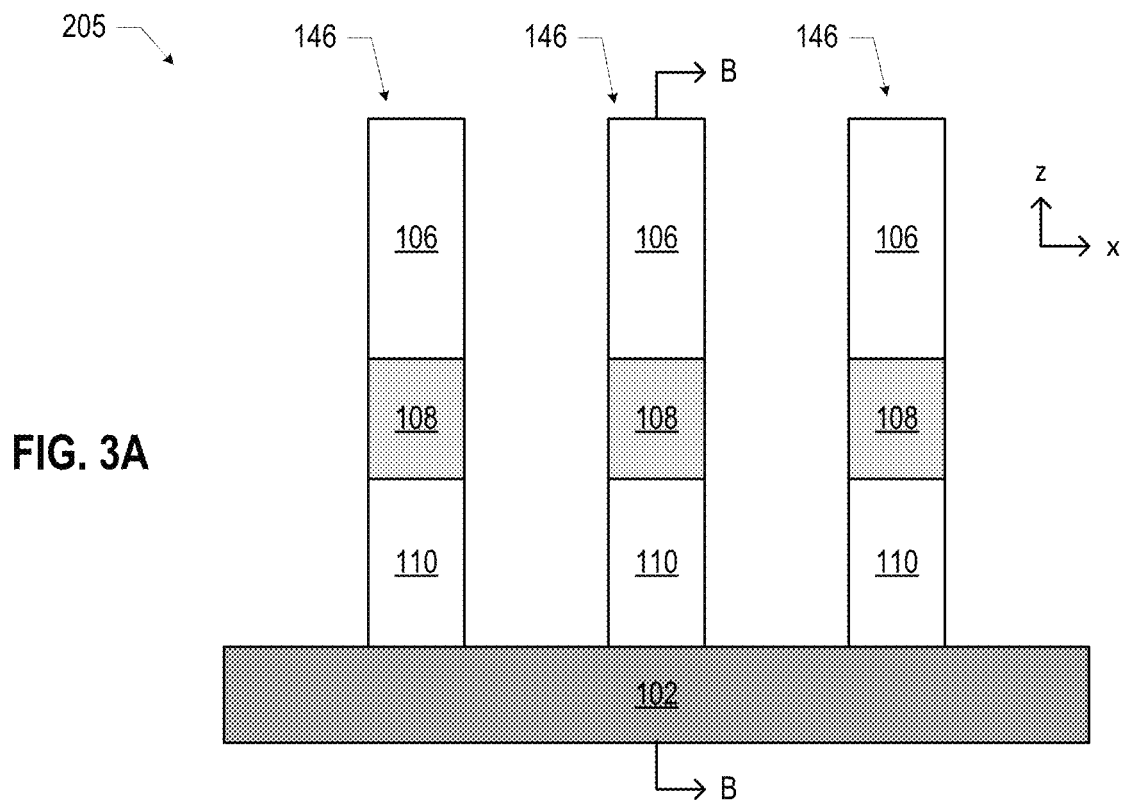
Figure 3B:
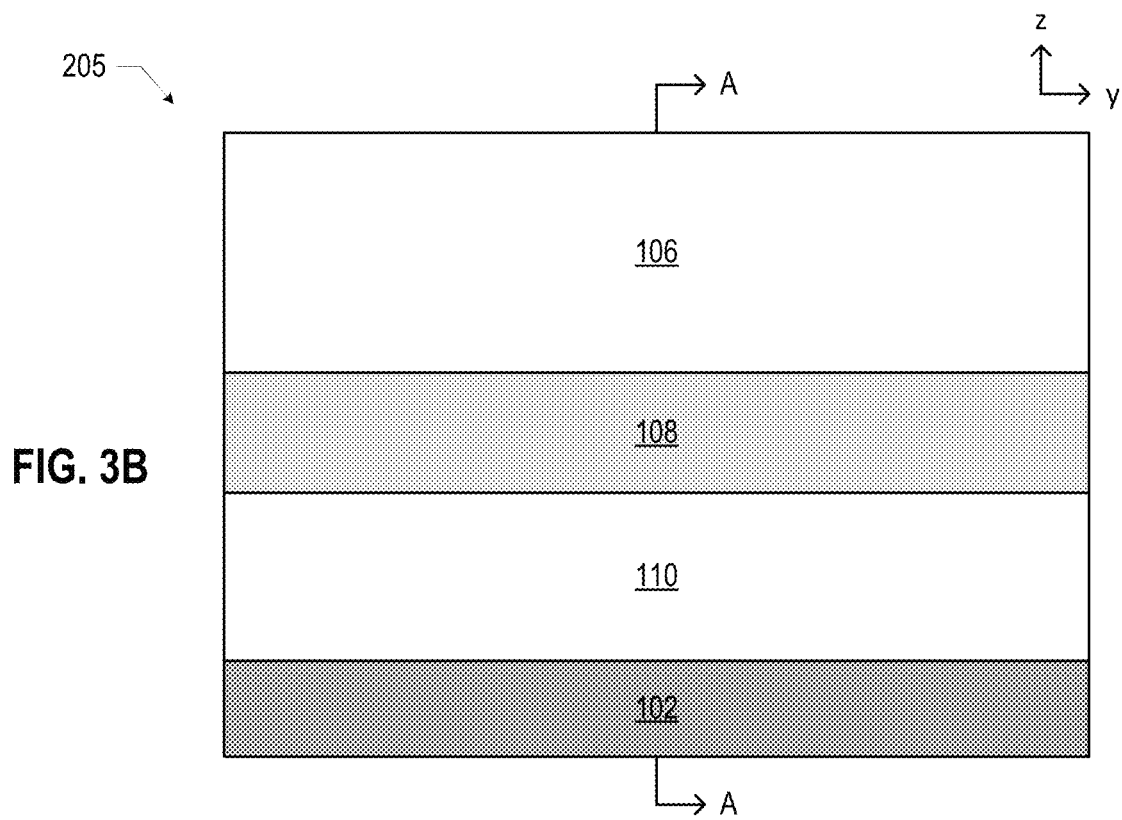

FIG. 3 illustrates an assembly 205 subsequent to forming fins 146 in the material stack of the assembly 200 (FIG. 2). Standard masking and etch techniques may be used to form the fins 146, including wet and/or dry etch schemes, as well as isotropic and/or anisotropic etch schemes. The width of the fins 146 may be equal to the width 137 of the fins 130, as discussed above. Any suitable number of fins 146 may be included in the assembly 205 (e.g., more or fewer than 3). Although the fins 146 depicted in FIG. 3 (and others of the accompanying drawings) are perfectly rectangular, this is simply for ease of illustration, and in practical manufacturing settings, the shape of the fins 146 may not be perfectly rectangular. For example, the fins 146 may be tapered, widening toward the base 102 (e.g., as discussed below with reference to FIG. 18). The top surface of the fins 146 may not be flat, but may be curved, rounding into the side surfaces of the fins 146. Further, the different materials in the fins 146 may etch at different rates, potentially resulting in indentations in the side surfaces of the fins 146 (corresponding to materials that etch more quickly) or protrusions in the side surfaces of the fins 146 (corresponding to materials that etch more slowly). For example, the fins 146 may have an hourglass shape in the x-z plane, in some embodiments. The techniques discussed above with reference to FIGS. 2 and 3 are simply one way in which the assembly 205 may be manufactured. For example, in other embodiments, the fins 146 are formed in an undoped material or material stack, and implant processes are performed after the fins 146 are formed in order to differentially dope the channel region 106, the intermediate region 108, and the contact region 110, as discussed above with reference to FIG. 1. Such embodiments may result in more diffuse boundaries between the channel region 106, the intermediate region 108, and the contact region 110 relative to embodiments in which material layers corresponding to these different regions are formed by epitaxy.

Figure 4A:
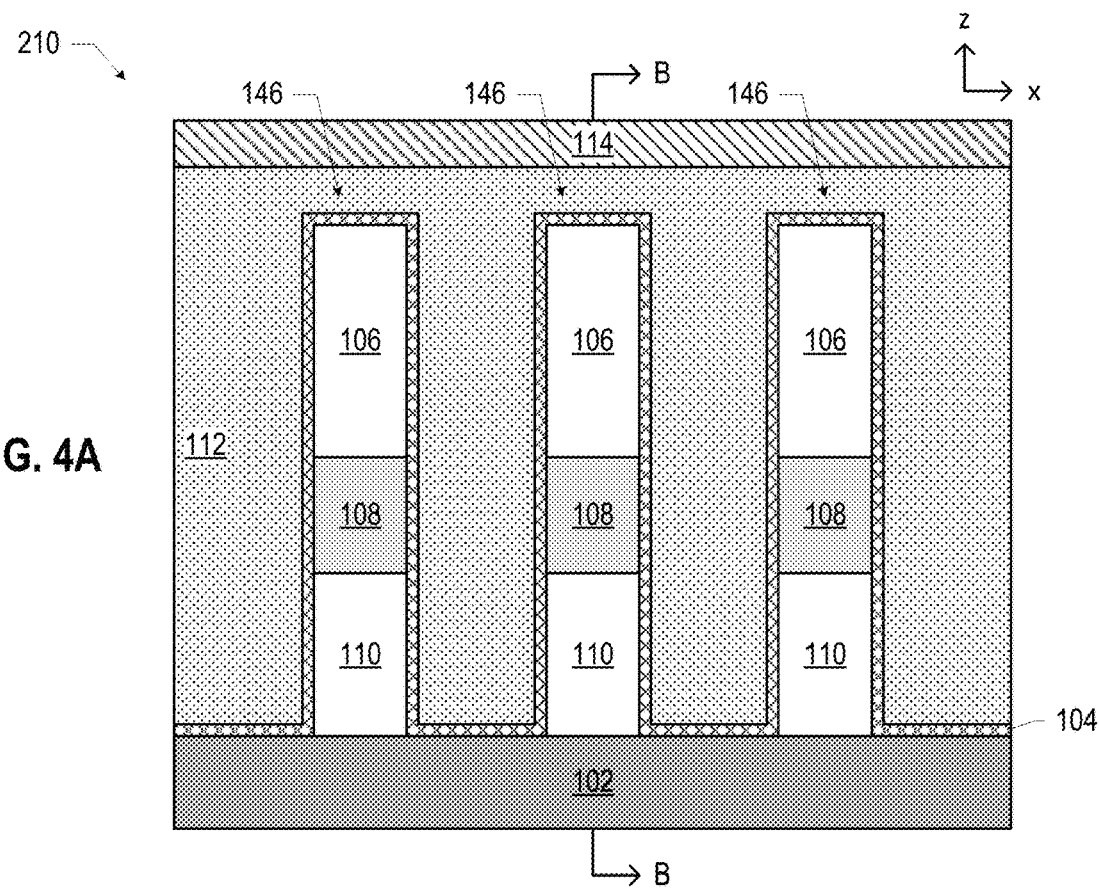
Figure 4B:
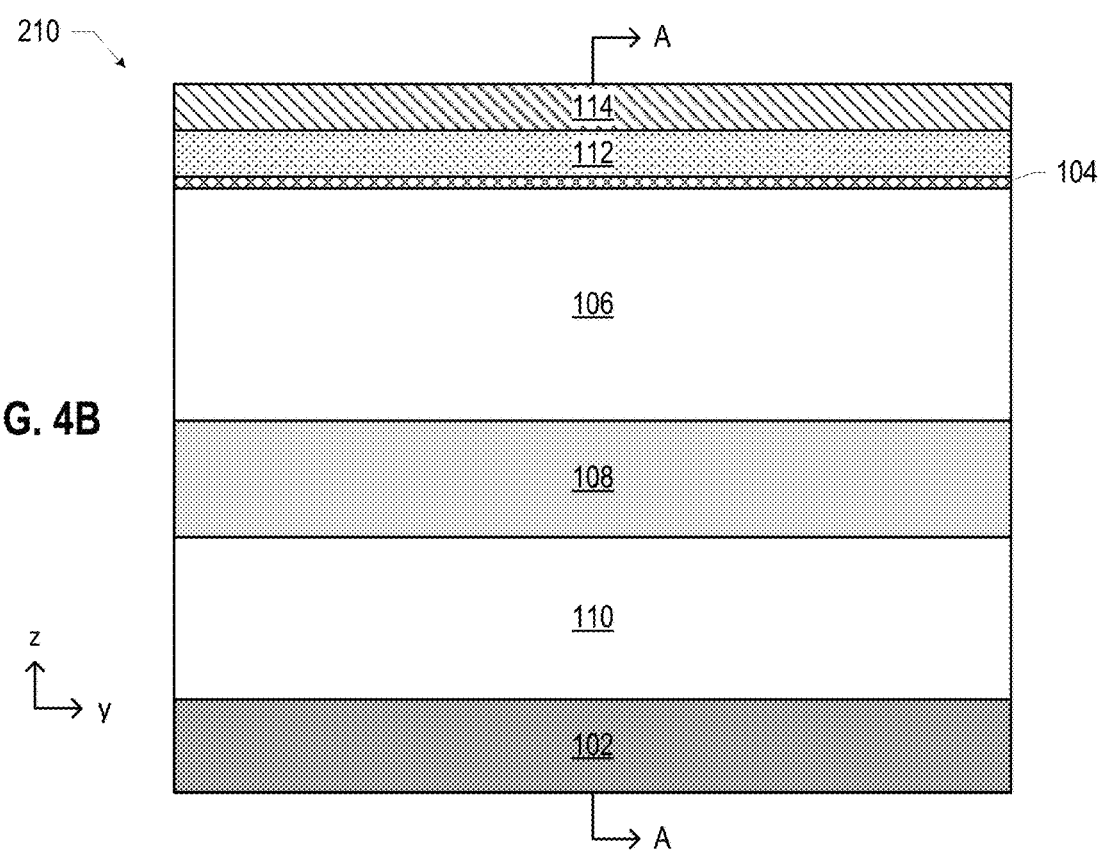

FIG. 4 illustrates an assembly 210 subsequent to forming a conformal layer of the dummy gate dielectric 104 over the assembly 205 (FIG. 3), forming a dummy gate stack 112, and then depositing a hardmask 114. The dummy gate stack 112 may extend over the top surfaces of the fins 146, as shown. The dummy gate dielectric 104 may be formed by any suitable technique (e.g., atomic layer deposition (ALD)), and the dummy gate stack 112 and hardmask 114 may be formed using any suitable techniques. The dummy gate dielectric 104 and the dummy gate stack 112 may include any suitable materials (e.g., silicon oxide and polysilicon, respectively). The hardmask 114 may include any suitable materials (e.g., silicon nitride, carbon-doped silicon oxide, or carbon-doped silicon oxynitride).

Figure 5A:
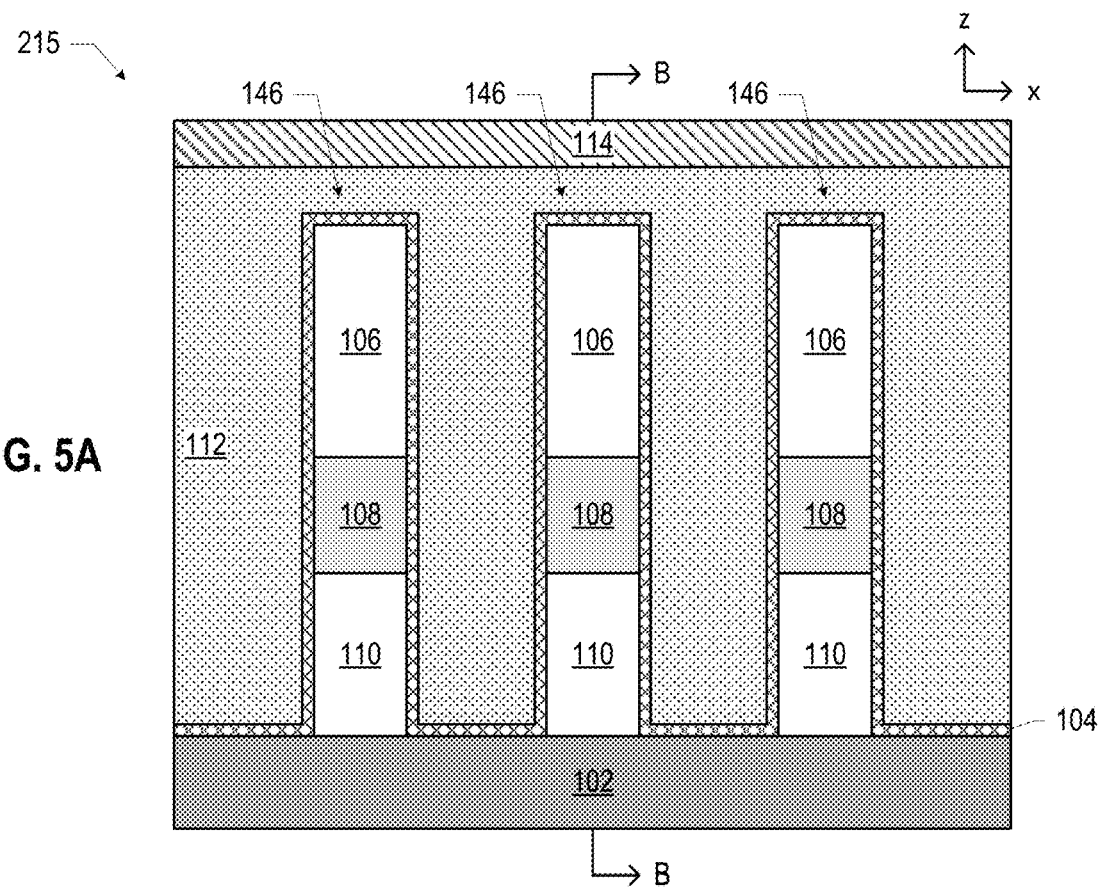
Figure 5B:
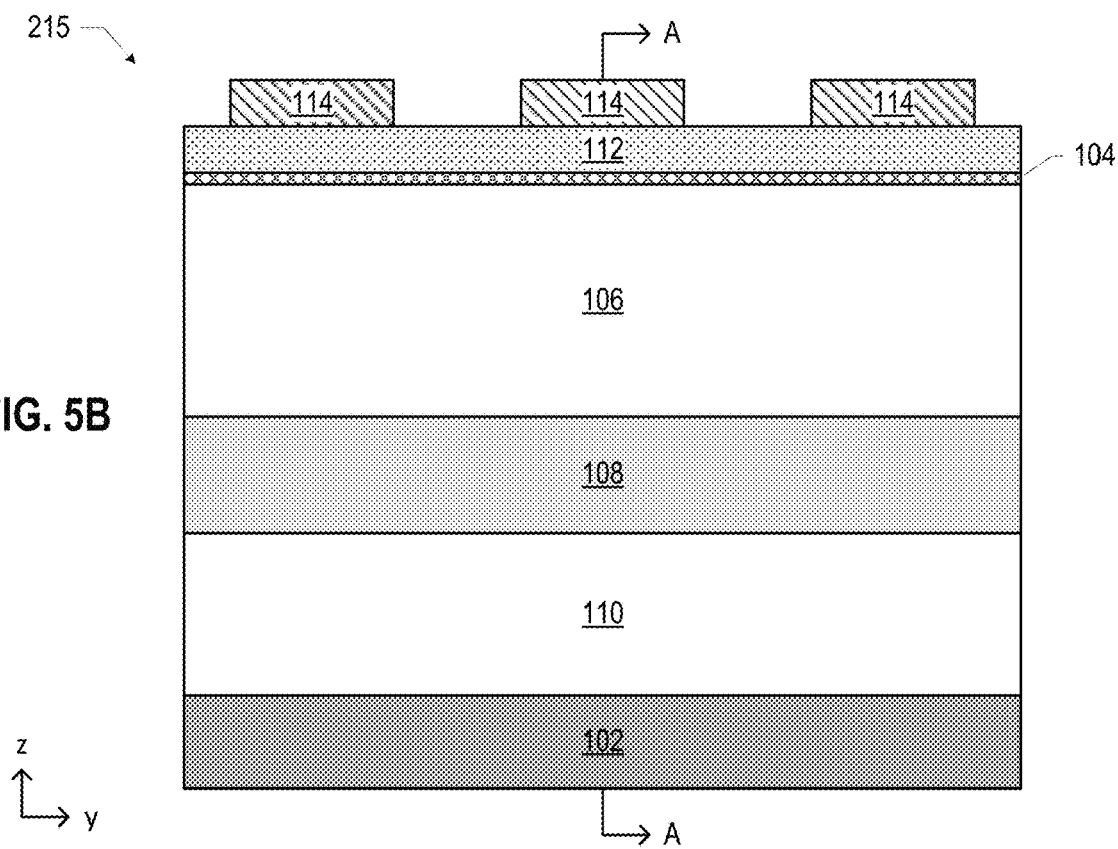

FIG. 5 illustrates an assembly 215 subsequent to patterning the hardmask 114 of the assembly 210 (FIG. 4) into strips that are oriented perpendicular to the longitudinal axis of the fins 146.

Figure 6A:
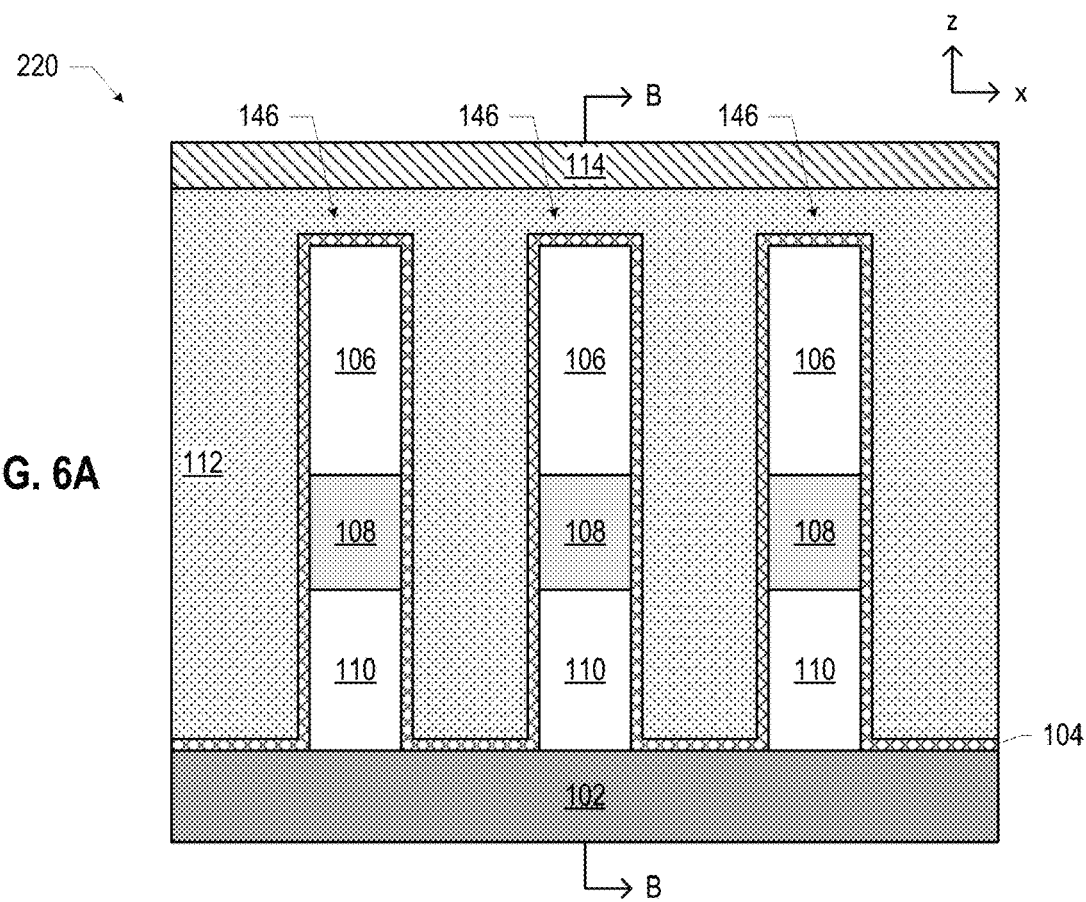
Figure 6B:
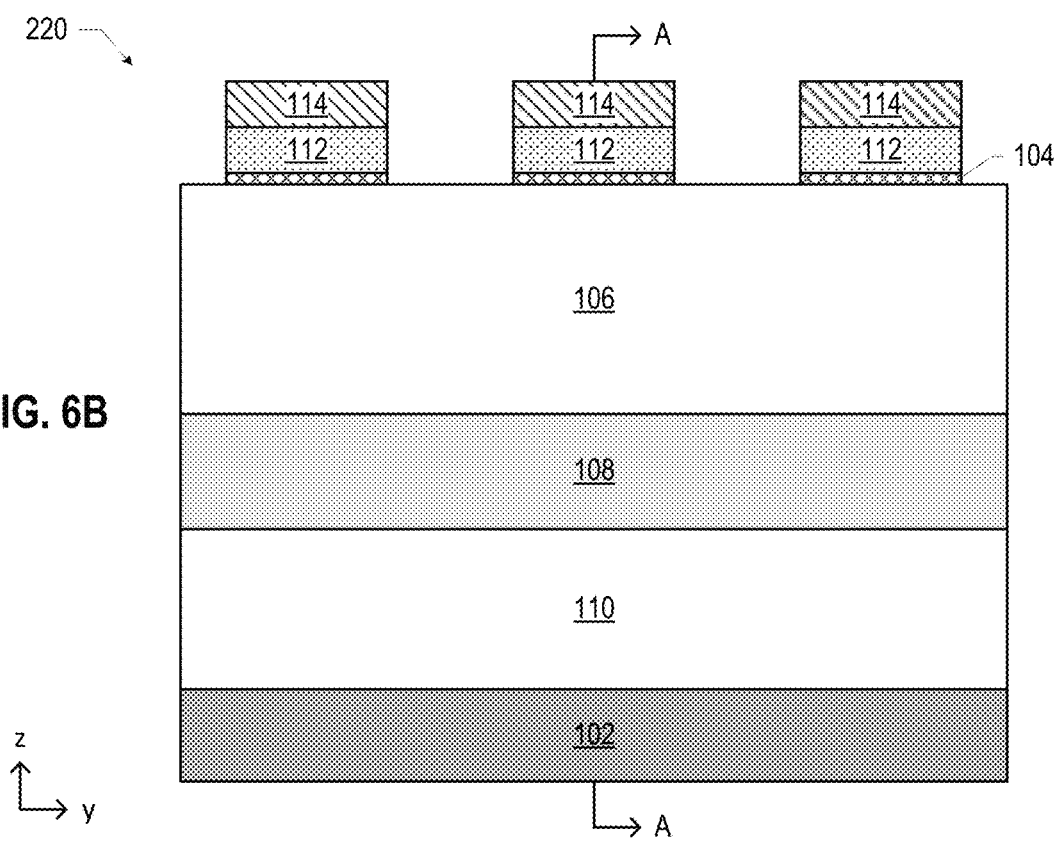

FIG. 6 illustrates an assembly 220 subsequent to etching the dummy gate stack 112 and dummy gate dielectric 104 using the patterned hardmask 114 as a mask. The locations of the remaining dummy gate stack 112 and dummy gate dielectric 104 may correspond to the locations of the gates in the IC structure 100, as discussed further below.

Figure 7A:
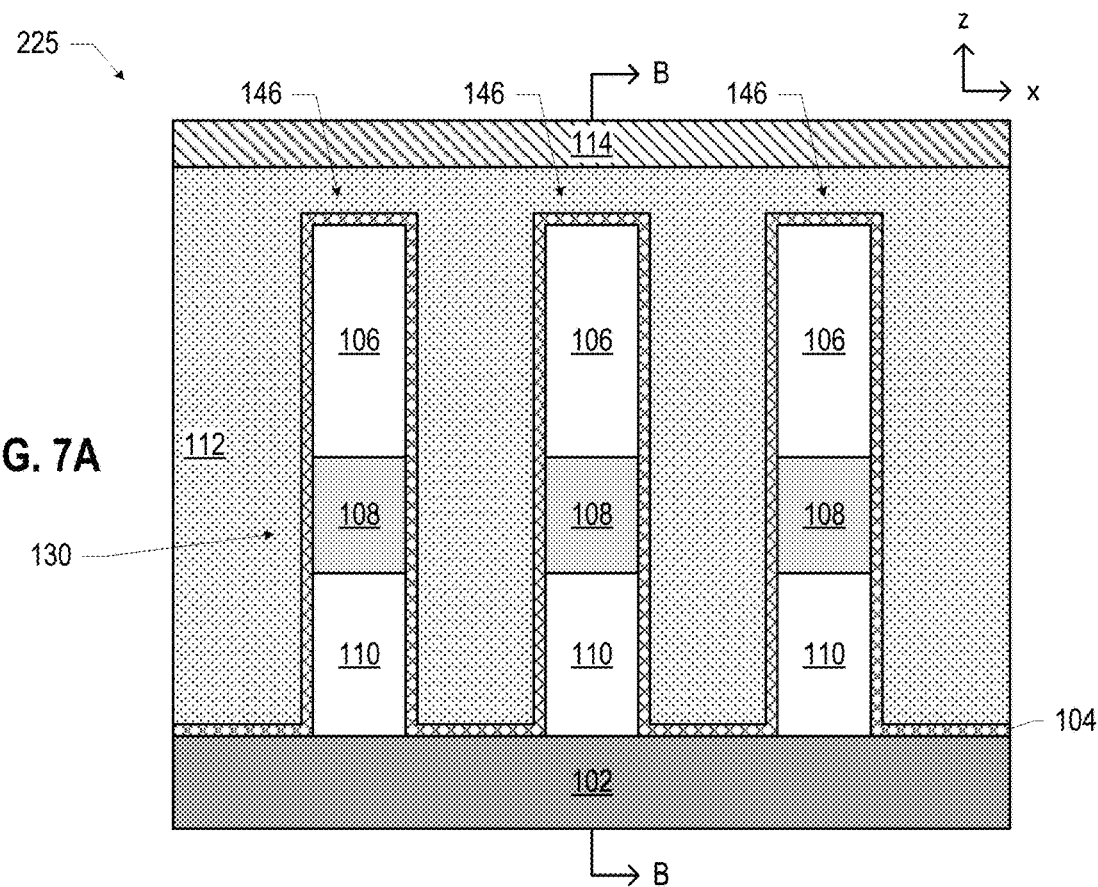
Figure 7B:
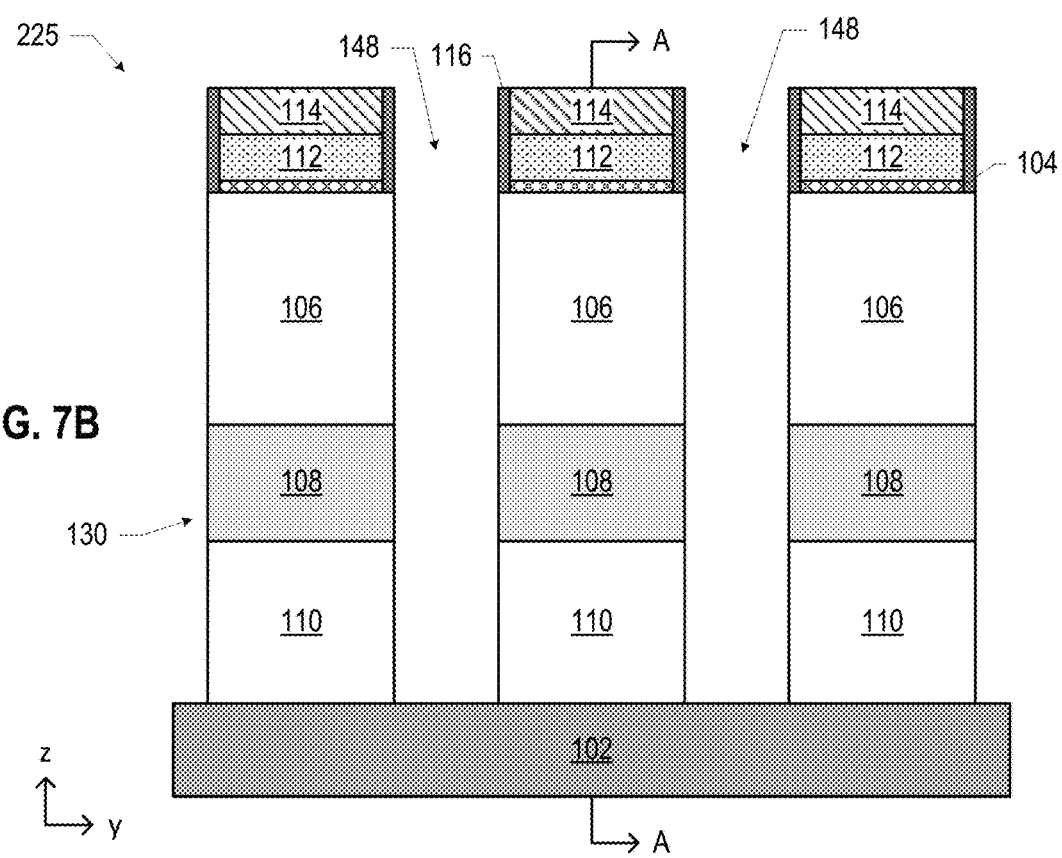

FIG. 7 illustrates an assembly 225 subsequent to forming spacers 116 on side faces of the hardmask 114, dummy gate stack 112, and dummy gate dielectric 104 of the assembly 220 (FIG. 6), and then removing the materials of the channel region 106, intermediate region 108, and contact region 110 that are not covered by the dummy gate stack 112, the dummy gate dielectric 104, or spacers 116 to form open volumes 148 between "smaller" fins 130. In some embodiments, the "exposed" channel region 106 may not be fully removed in the assembly 225; instead, "stubs" may extend into the open volumes 148, and will ultimately extend into the S/D regions 136 in the IC structure 100, as discussed below with reference to FIG. 17. The spacers 116 may be formed by conformally depositing the material of the spacers 116 on the assembly 220, then directionally etching this material "downwards" to leave the spacers 116 on "vertical" surfaces of the assembly 220 while removing it from "horizontal" surfaces. In some embodiments, the materials of the channel region 106, intermediate region 108, and contact region 110 that are not covered by the dummy gate stack 112, the dummy gate dielectric 104, or spacers 116 may be removed using a dry etch.

Figure 8A:
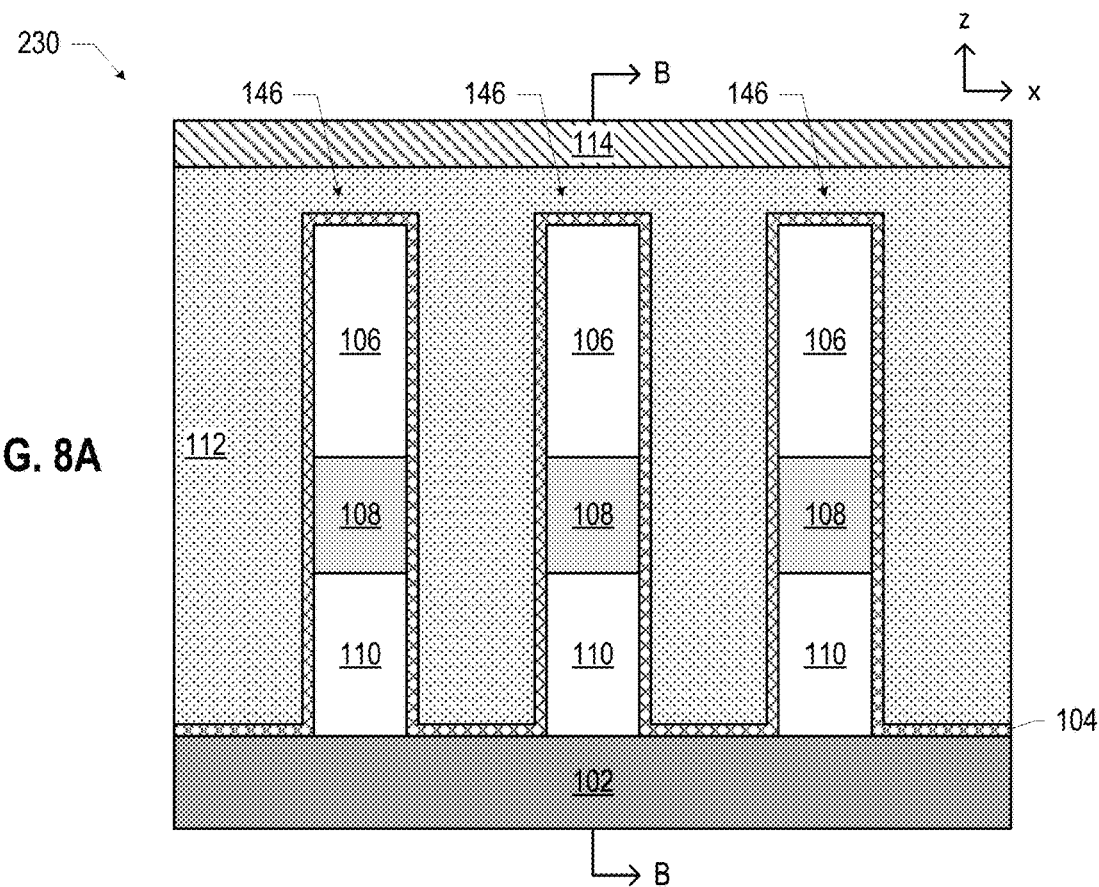
Figure 8B:
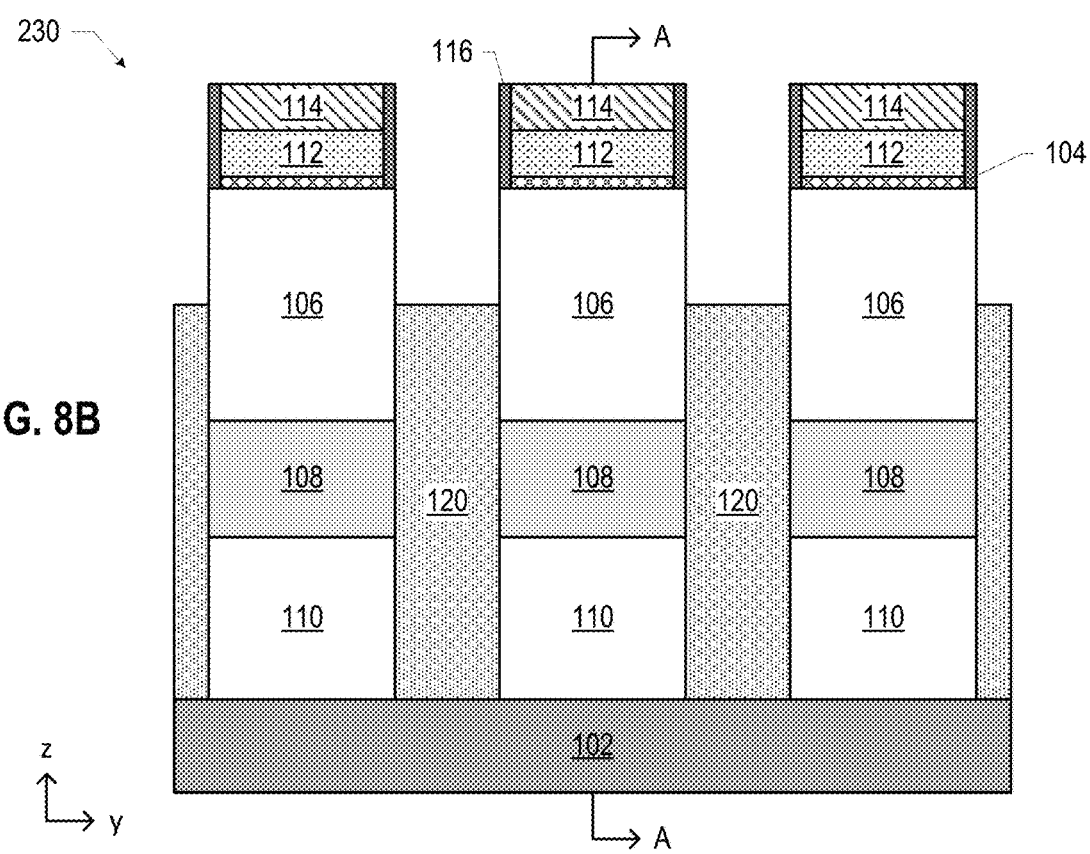

FIG. 8 illustrates an assembly 230 subsequent to forming dielectric material 120 in the open volumes 148 of the assembly 225 (FIG. 7). In some embodiments, the dielectric material 120 may be deposited to an initial height and then recessed back so that the top surface of the dielectric material is coplanar with the channel regions 106, as shown. In some embodiments, the top surface of the dielectric material 120 may not be perfectly horizontal and may include a "U" or bowl shape or undulations in height.

Figure 9A:
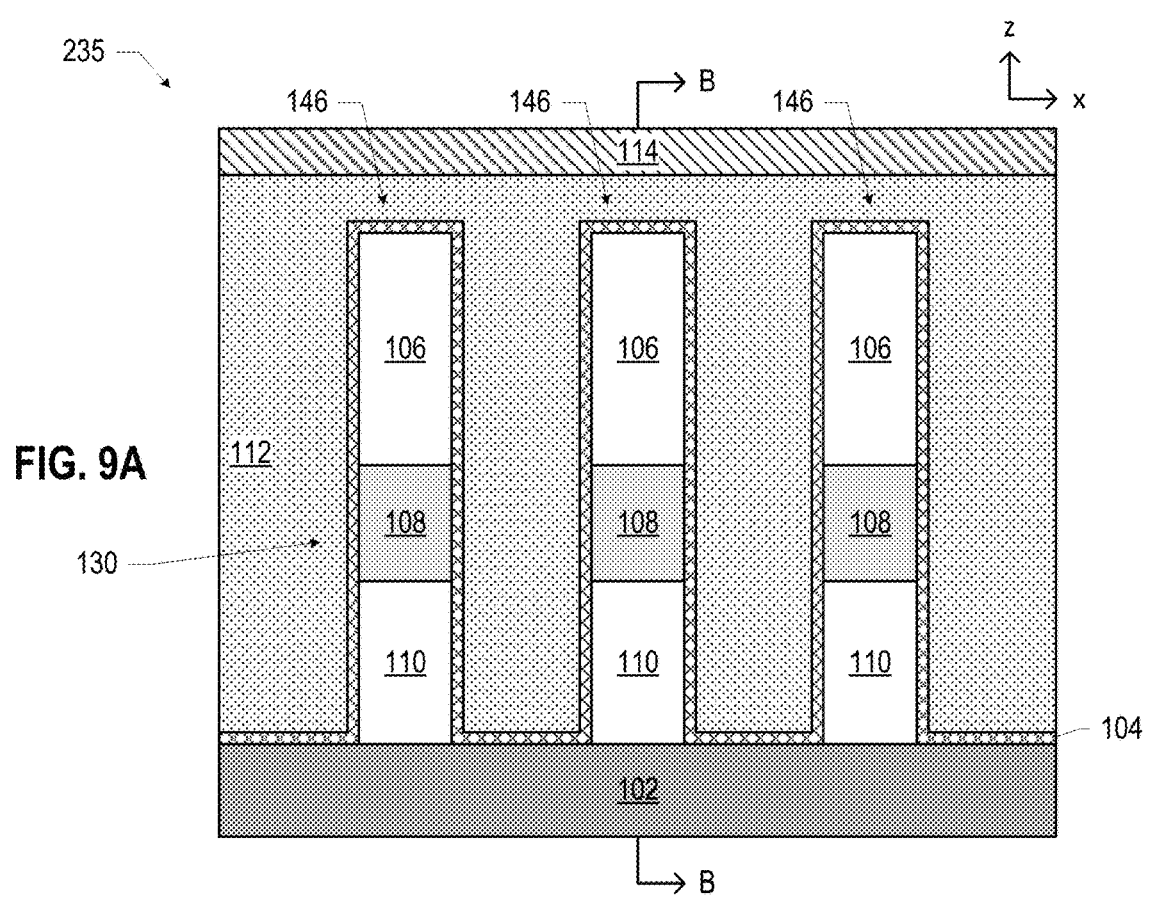
Figure 9B:
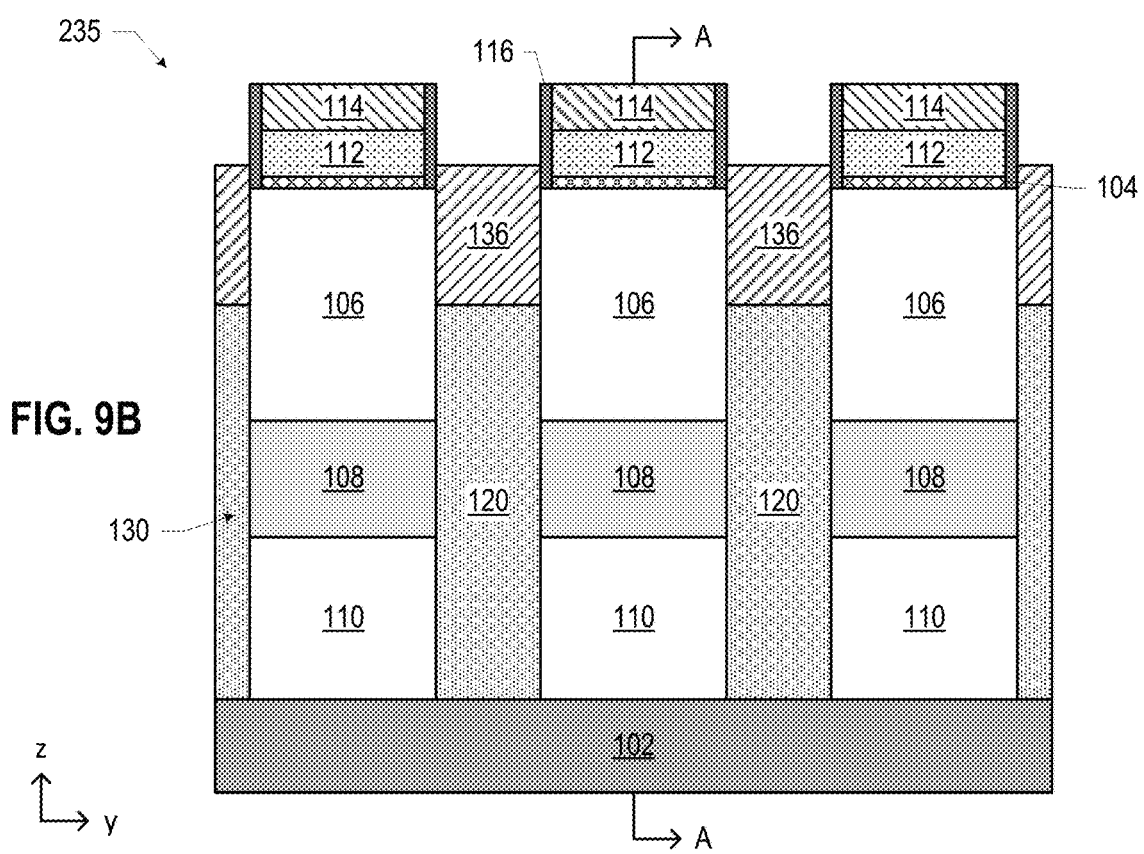

FIG. 9 illustrates an assembly 235 subsequent to forming S/D regions 136 on the dielectric material 120 of the assembly 230 (FIG. 8), proximate to the channel regions 106. The S/D regions 136 may be formed by epitaxial growth. For example, the S/D regions 136 may be faceted and overgrown from a trench in the dielectric material 120. In some embodiments, the S/D regions 136 may be a multilayer structure (e.g., a germanium cap on a silicon germanium body, or a germanium body and a carbon-containing silicon germanium spacer or liner between the channel region 106 and the germanium body). In some embodiments, a portion of the S/D regions 136 may have a component that is graded in composition (e.g., a graded germanium concentration to facilitate lattice matching, or a graded dopant concentration to facilitate low contact resistance).

Figure 10A:
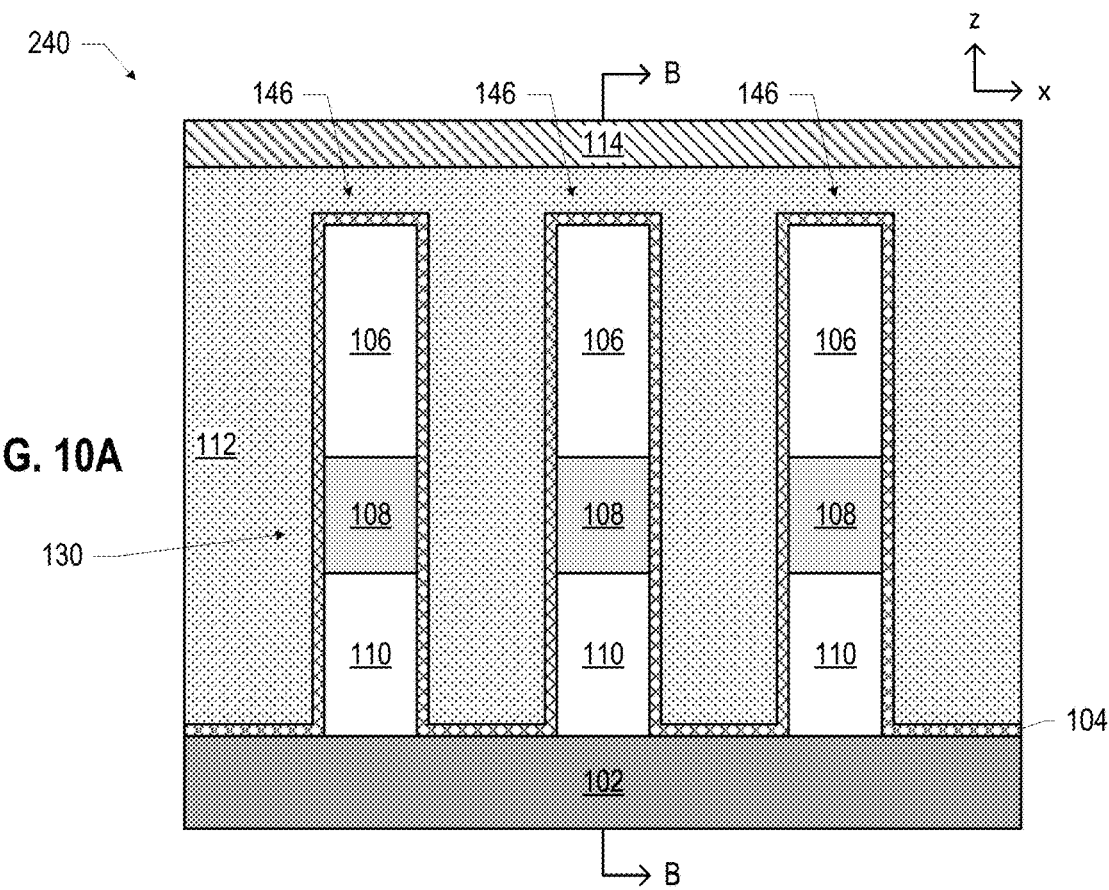
Figure 10B:
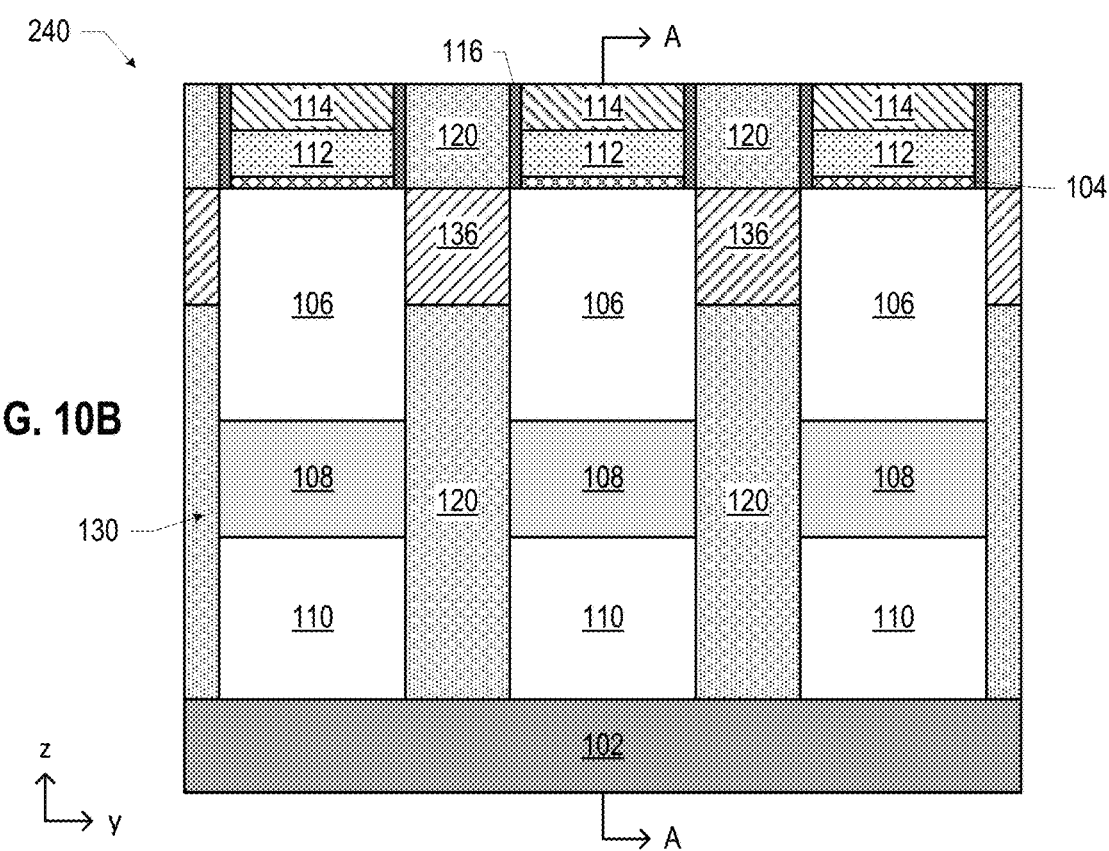

FIG. 10 illustrates an assembly 240 subsequent to forming additional dielectric material 120 on the S/D regions 136 of the assembly 235 (FIG. 9). In some embodiments, the dielectric material 120 may be deposited and then planarized to yield the assembly 240.

Figure 11A:
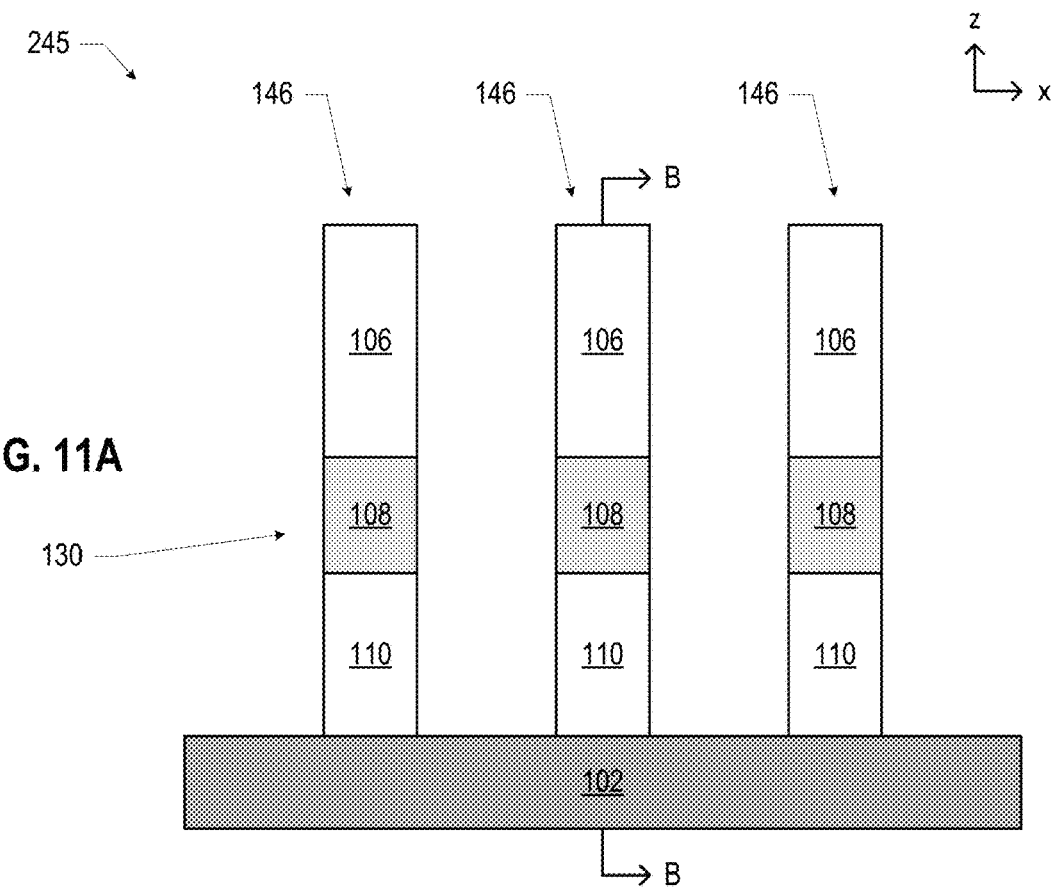
Figure 11B:
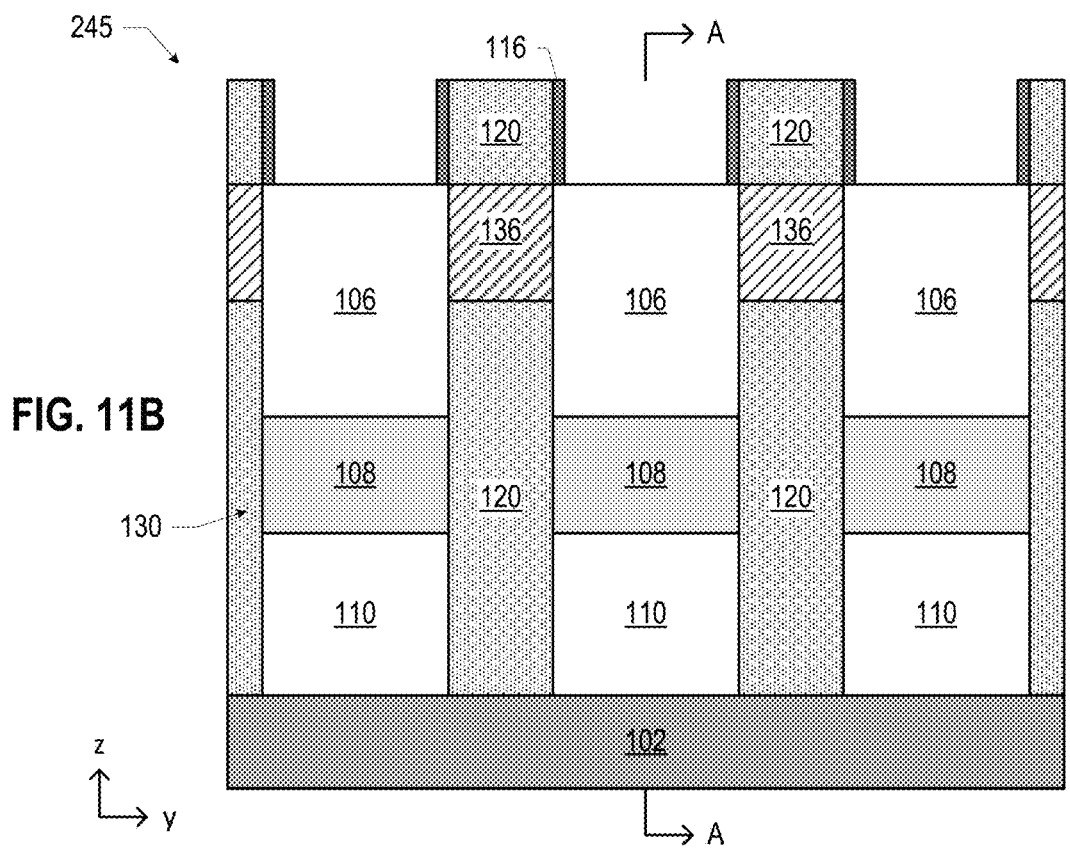
Figure 12A:
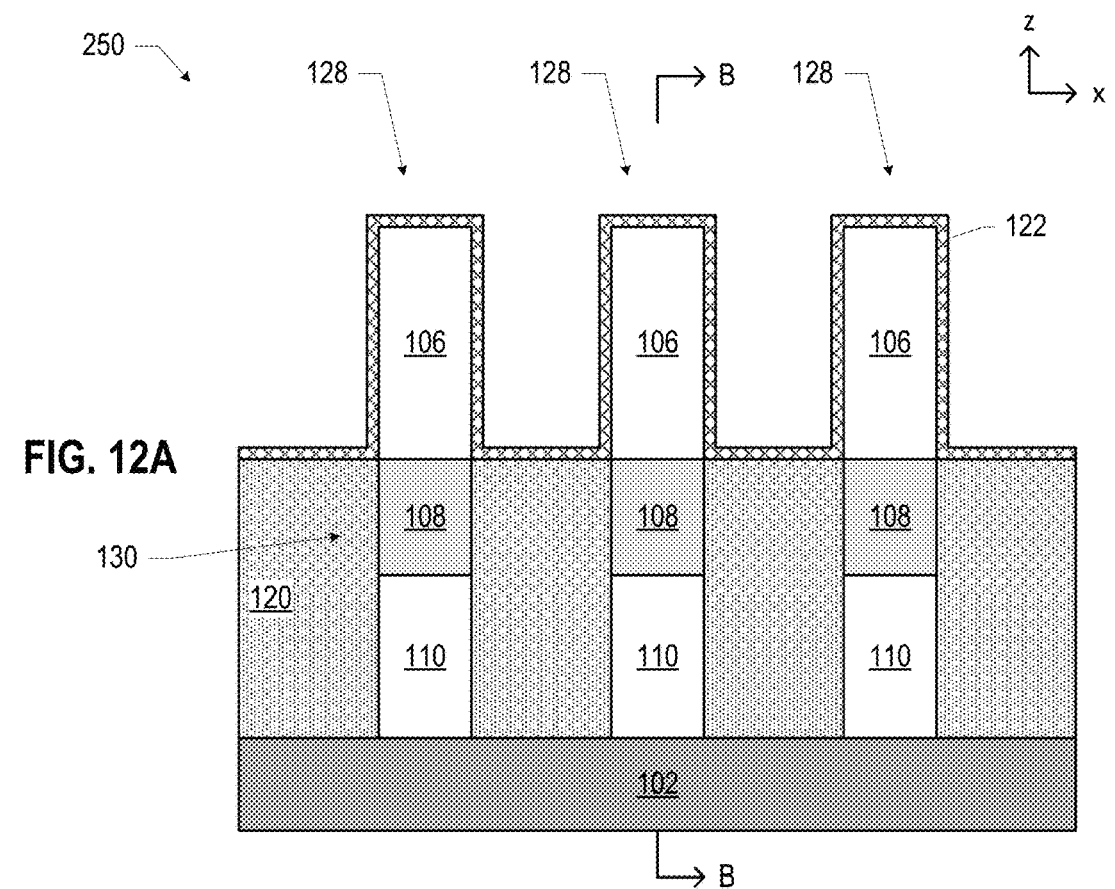
Figure 12B:
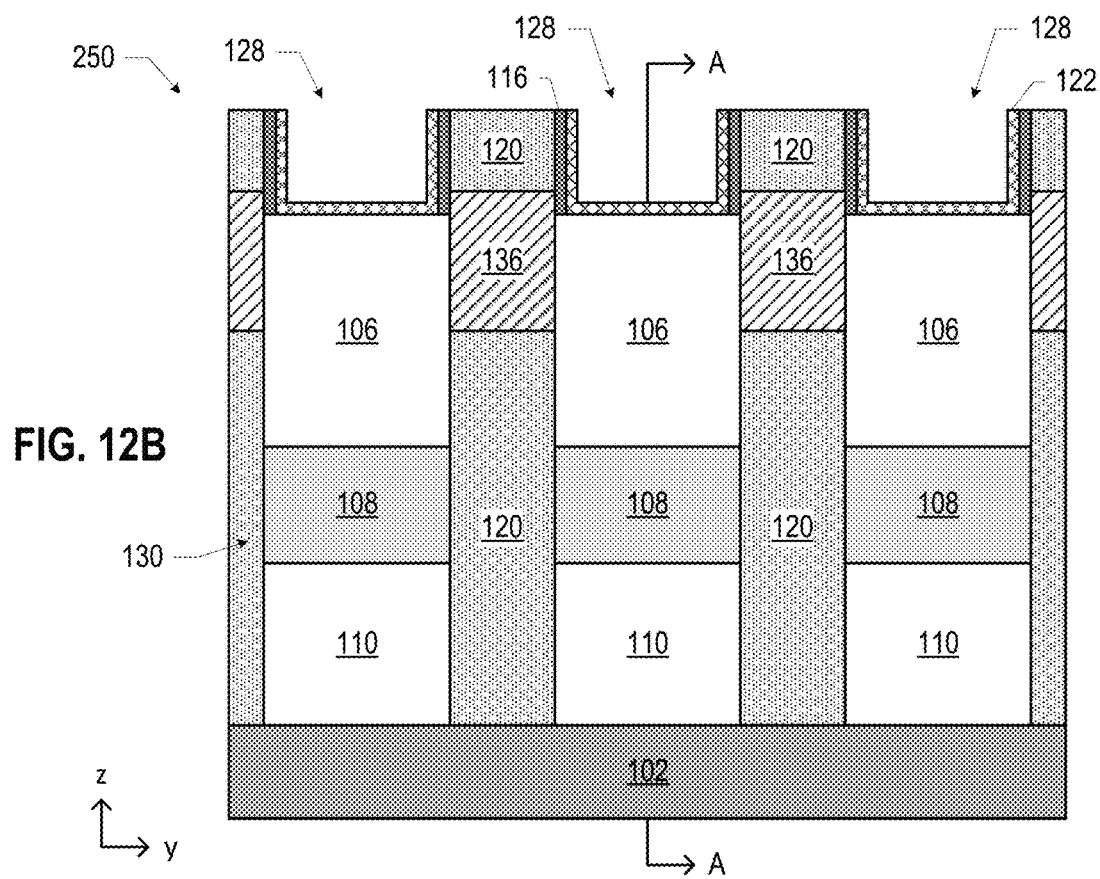

FIG. 11 illustrates an assembly 245 subsequent to removing the hardmask 114, the dummy gate dielectric 104, and the dummy gate stack 112 from the assembly 240 (FIG. 10). Any suitable etch processes may be used to remove the hardmask 114, the dummy gate dielectric 104, and the dummy gate stack 112. In some embodiments, FIG. 12 illustrates an assembly 250 subsequent to depositing and recessing additional dielectric material 120 on the assembly 245 (FIG. 11) to the level of the interface between the channel region 106 and the intermediate region 108, and then forming a conformal layer of the gate dielectric 122 over the result. As shown, the gate dielectric 122 may be present on the exposed surfaces of the dielectric material 120. In other embodiments, as discussed further below with reference to FIG. 16, the gate dielectric 122 may be chosen so that it selectively forms only on the exposed channel region 106, and not on the exposed dielectric material 120. In other embodiments, the dummy gate dielectric 104 and the dummy gate stack 112 may not be completely removed from the assembly 240, and instead may only be recessed down to the level of the interface between the channel region 106 and the intermediate region 108; this remaining dummy gate dielectric 104 and dummy gate stack 112 may then serve as the additional dielectric material 120 of the assembly 250.

Figure 13A:
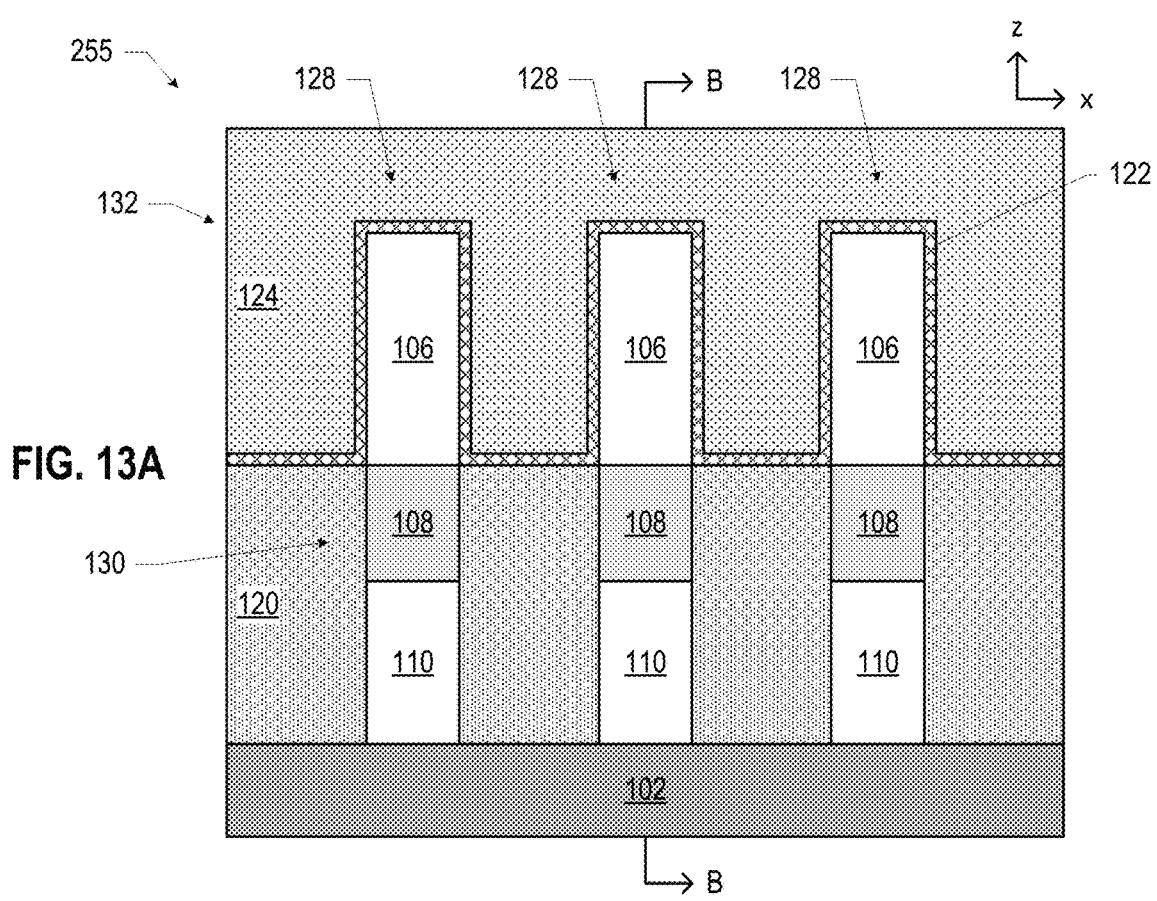
Figure 13B:
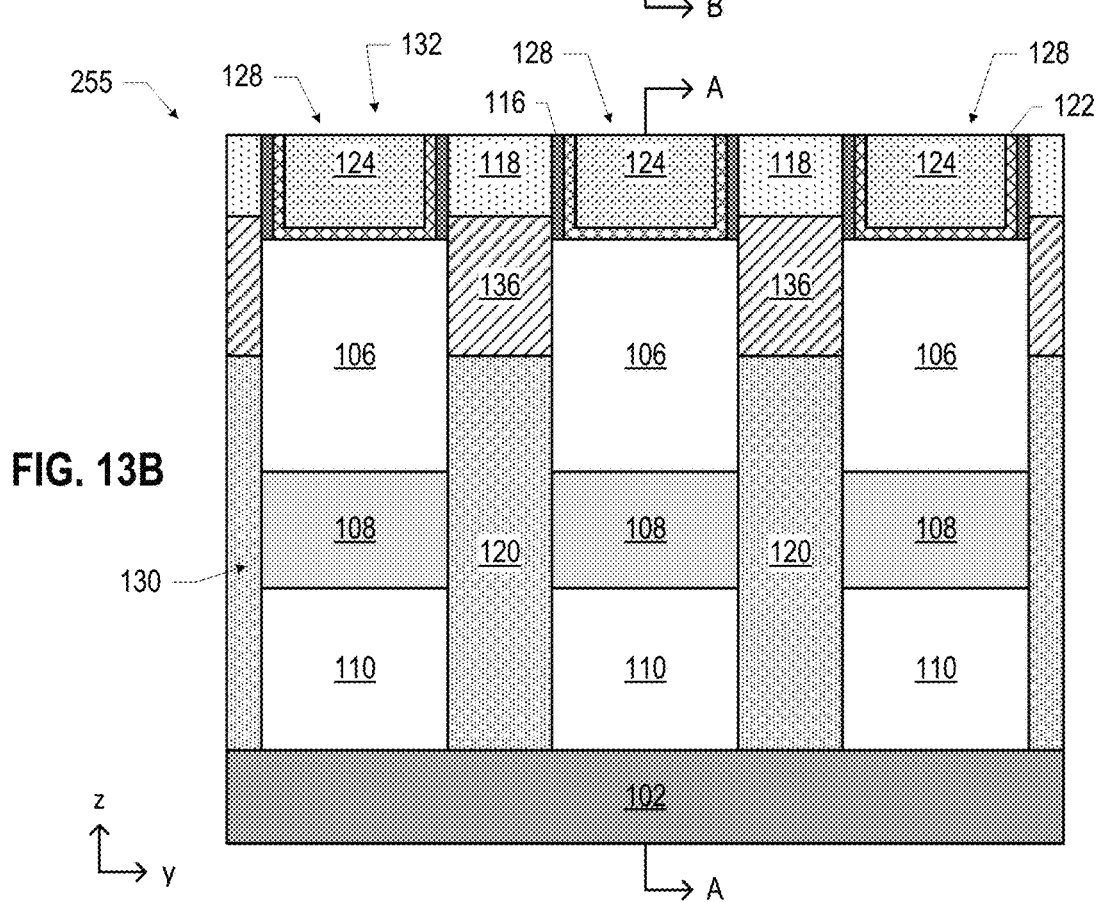

FIG. 13 illustrates an assembly 255 subsequent to forming a gate stack 124 on the gate dielectric 122 of the assembly 250 (FIG. 12), and then forming the S/D contacts 118. The gate stack 124 and the S/D contacts 118 may be formed using any suitable techniques; gate contacts (not shown) may also be formed. In some embodiments, further interconnect layers of a metallization stack (e.g., a metallization stack 1619-1, discussed below with reference to FIG. 20) may be fabricated on the assembly 255 before proceeding with the operations discussed below with reference to FIG. 14, including conductive lines and/or vias in electrical contact with the S/D contacts 118 and the gate 132.

Figure 14A:
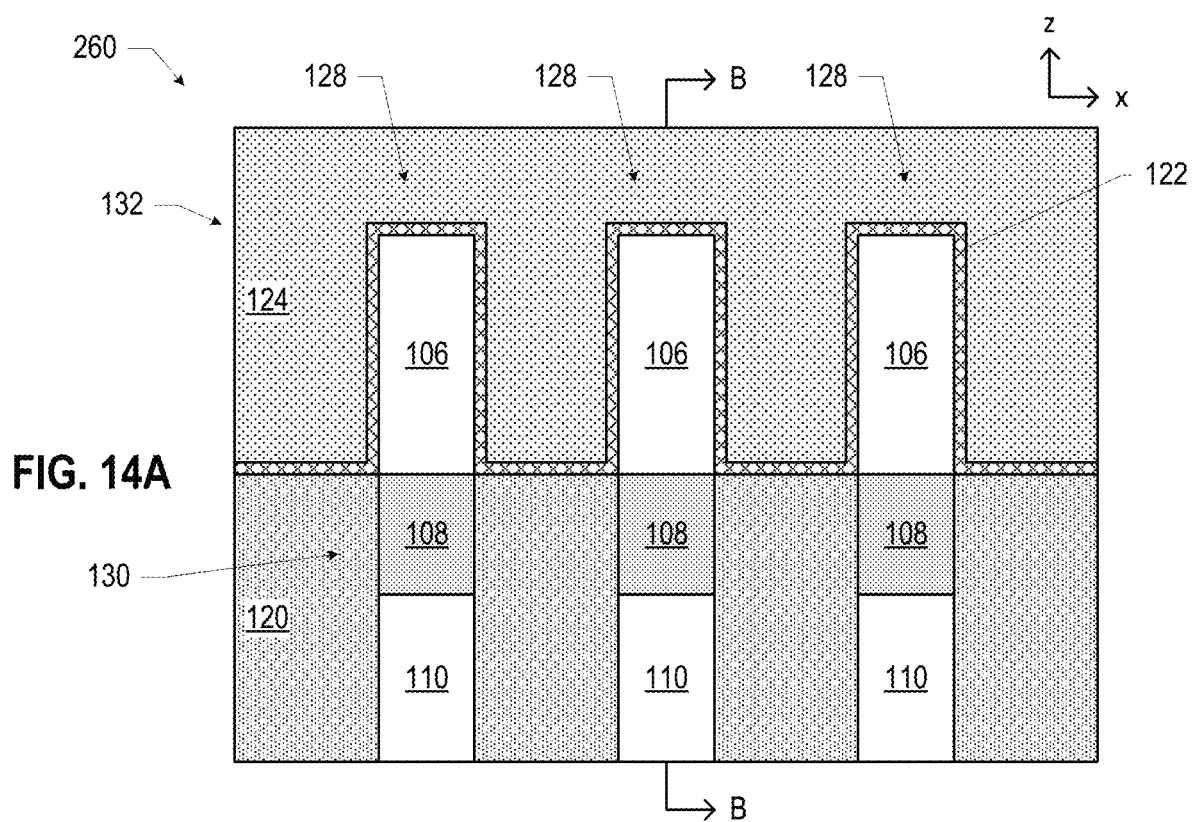
Figure 14B:
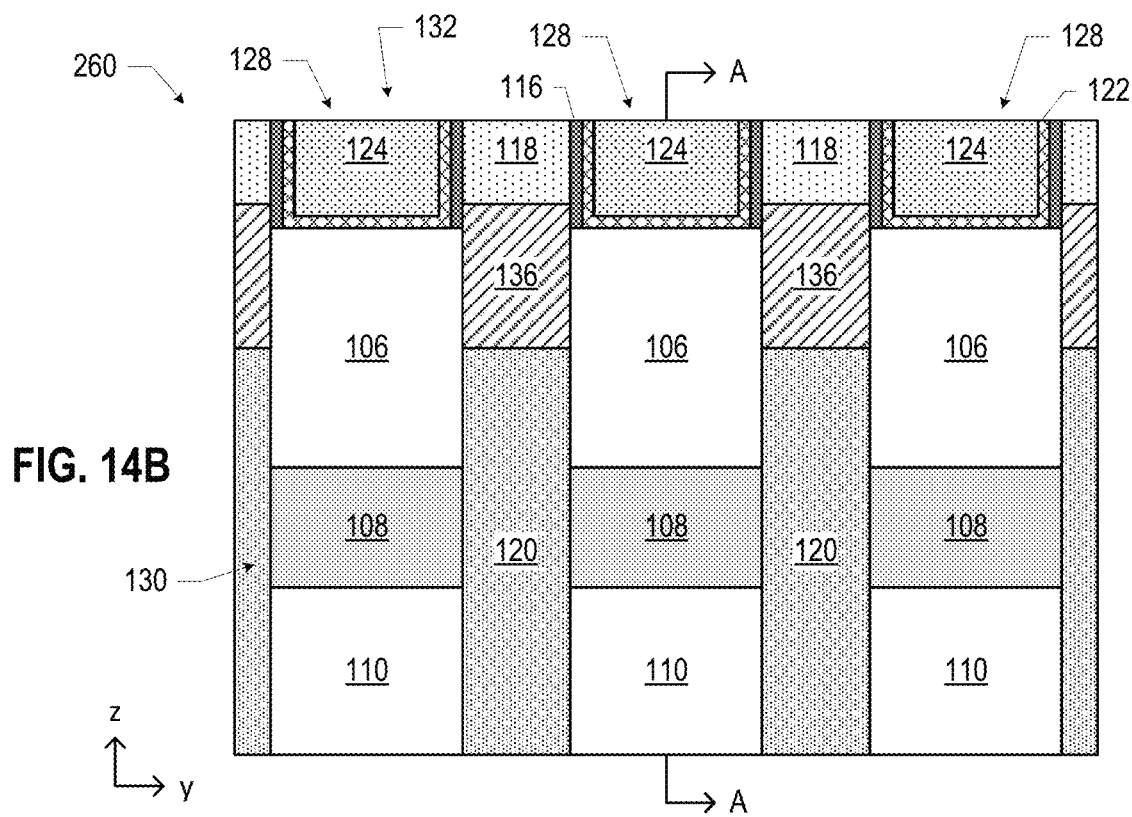

FIG. 14 illustrates an assembly 260 subsequent to removing the base 102 from the assembly 255 (FIG. 13). The base 102 may be removed using a planarization technique (e.g., chemical mechanical planarization (CMP) or any other suitable technique. Removing the base 102 may expose the bottom surface of the contact region 110, as shown.

Figure 15A:
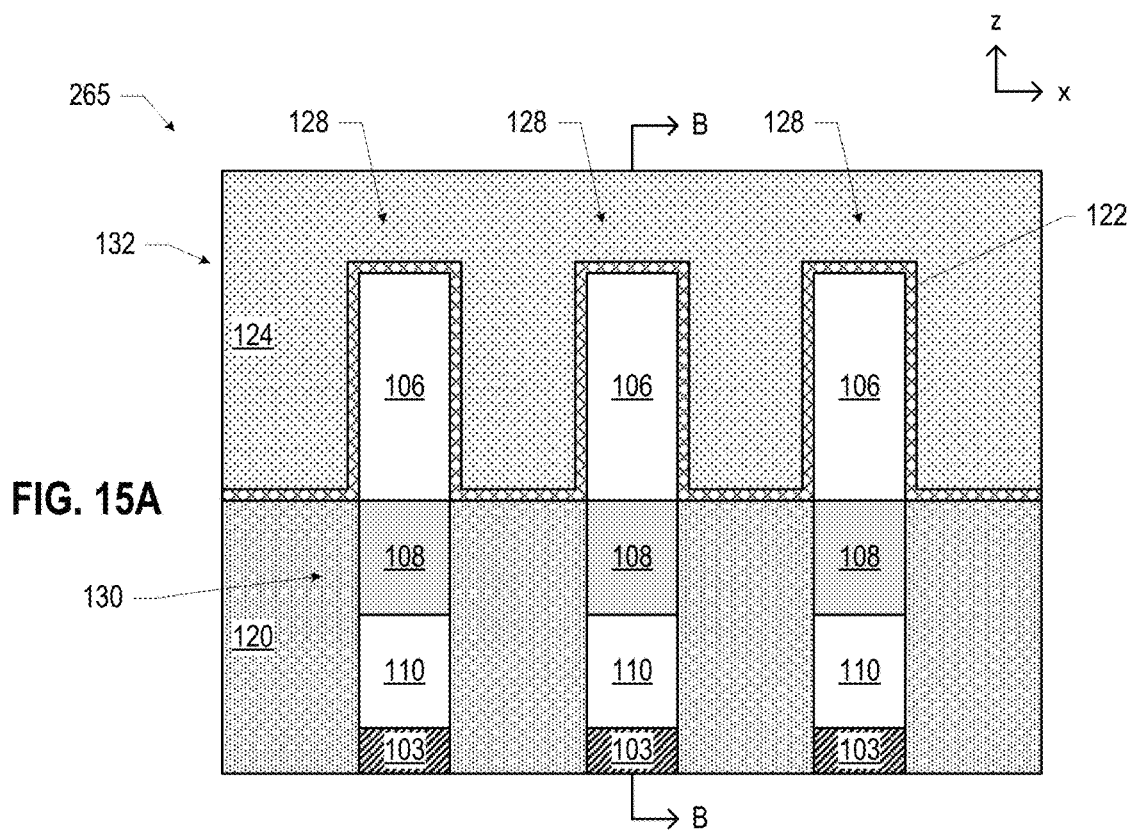
Figure 15B:
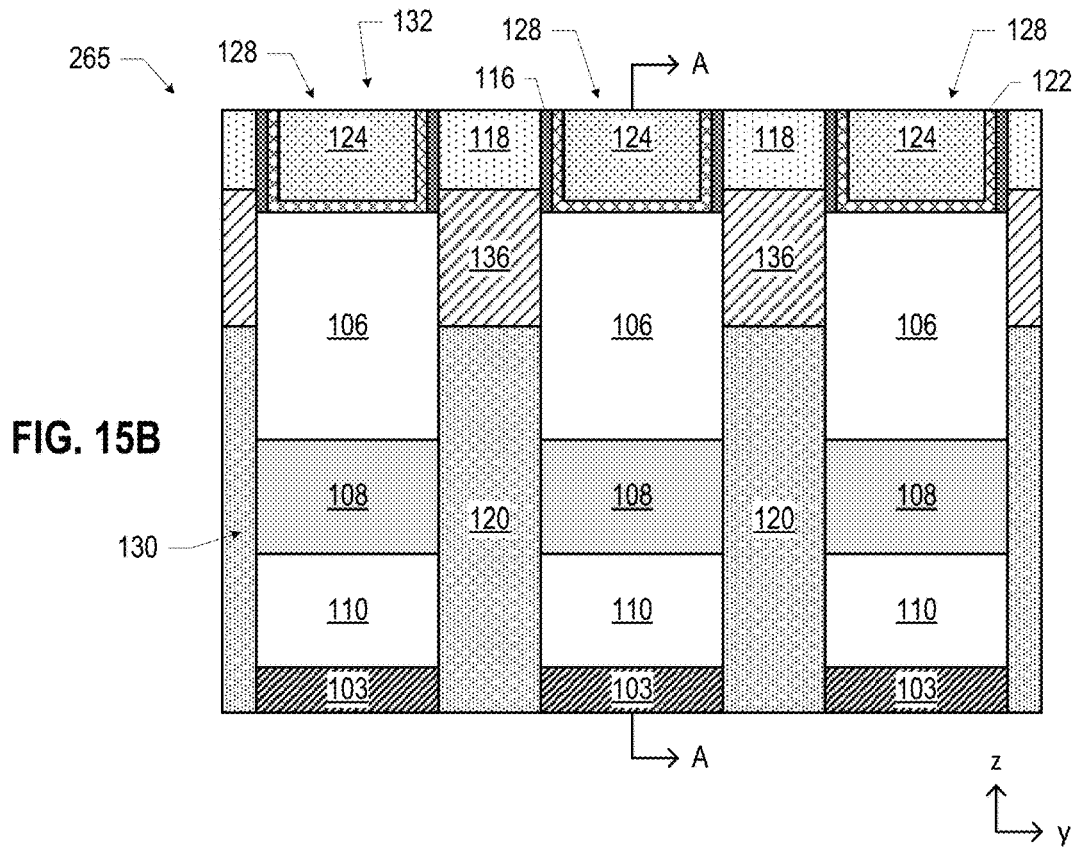

FIG. 15 illustrates an assembly 265 subsequent to forming the body contact 103 on the assembly 260 (FIG. 14). The body contact 103 may be formed by recessing the contact region 110 and then filling the recess with material(s) of the body contact 103. Other techniques may be used to form the body contact 103. For example, materials having etch selectivity relative to each other may be included in the assembly 200 (FIG. 2) between the base 102 and the contact region 110; following completion of the "topside" processing discussed above with reference to FIGS. 2-13, and removal of the base 102 as discussed above with reference to FIG. 14, the exposed materials may be subject to a controlled etch process followed by a lithography and etch/deposition process to form the body contacts 103. The assembly 265 may take the form of the IC structure 100 of FIG. 1. For example, in some embodiments, further interconnect layers of a metallization stack (e.g., a metallization stack 1619-2, discussed below with reference to FIG. 20) may be fabricated on the assembly 265, including conductive lines and/or vias in electrical contact with the body contact 103.

Figure 16A:
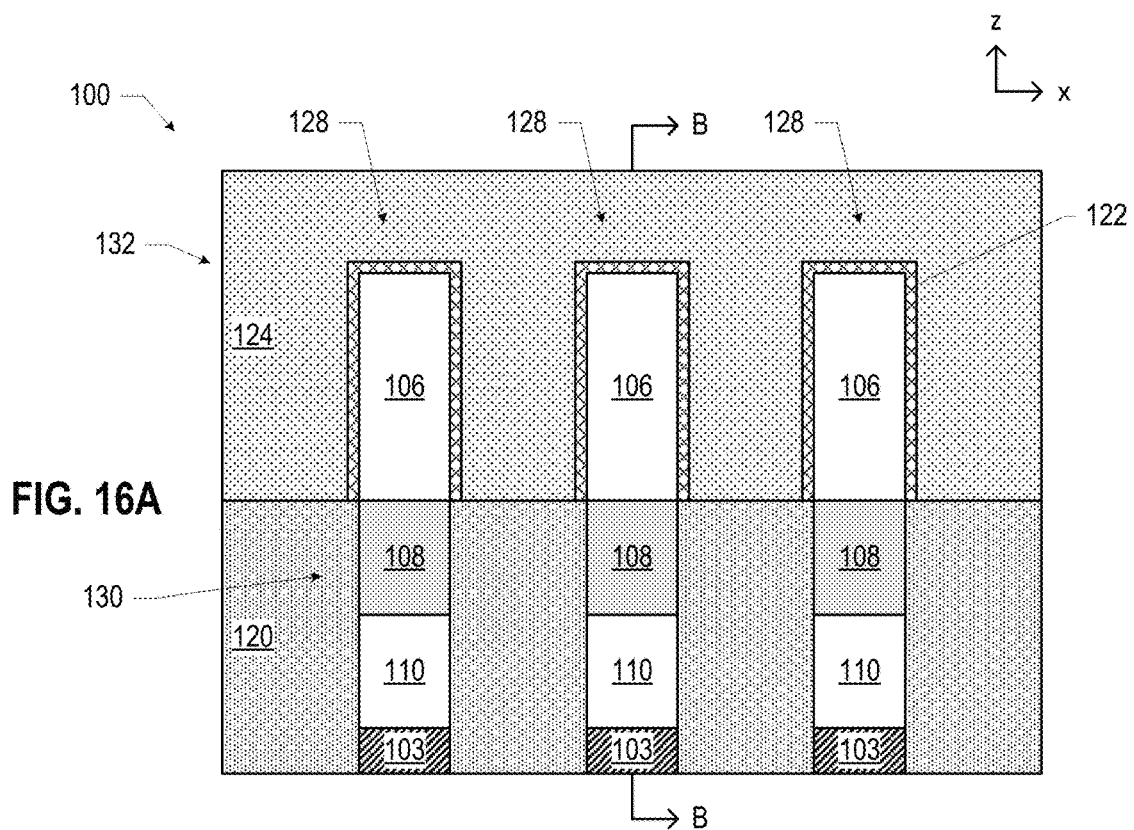
FIGS. 16A-16B, 17A-17B, and 18A-18B are cross-sectional views of example IC structures, in accordance with various embodiments.
Figure 16B:
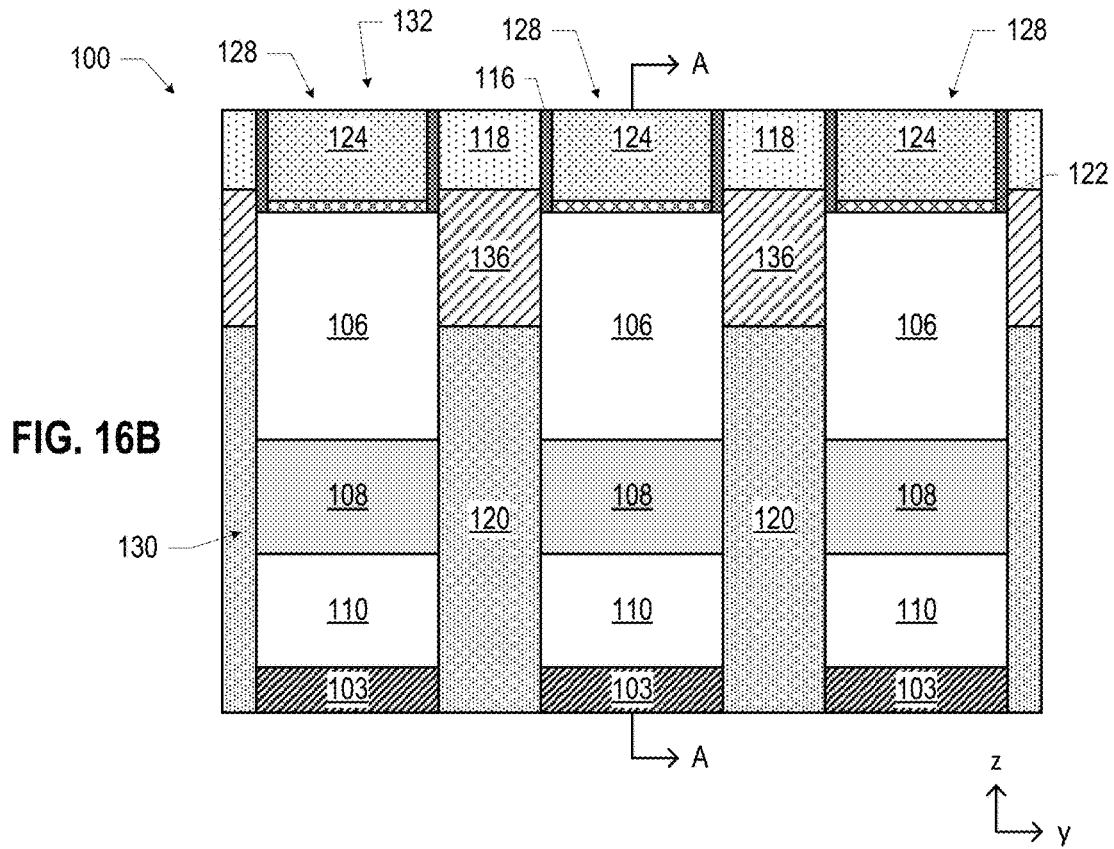
Figure 17A:
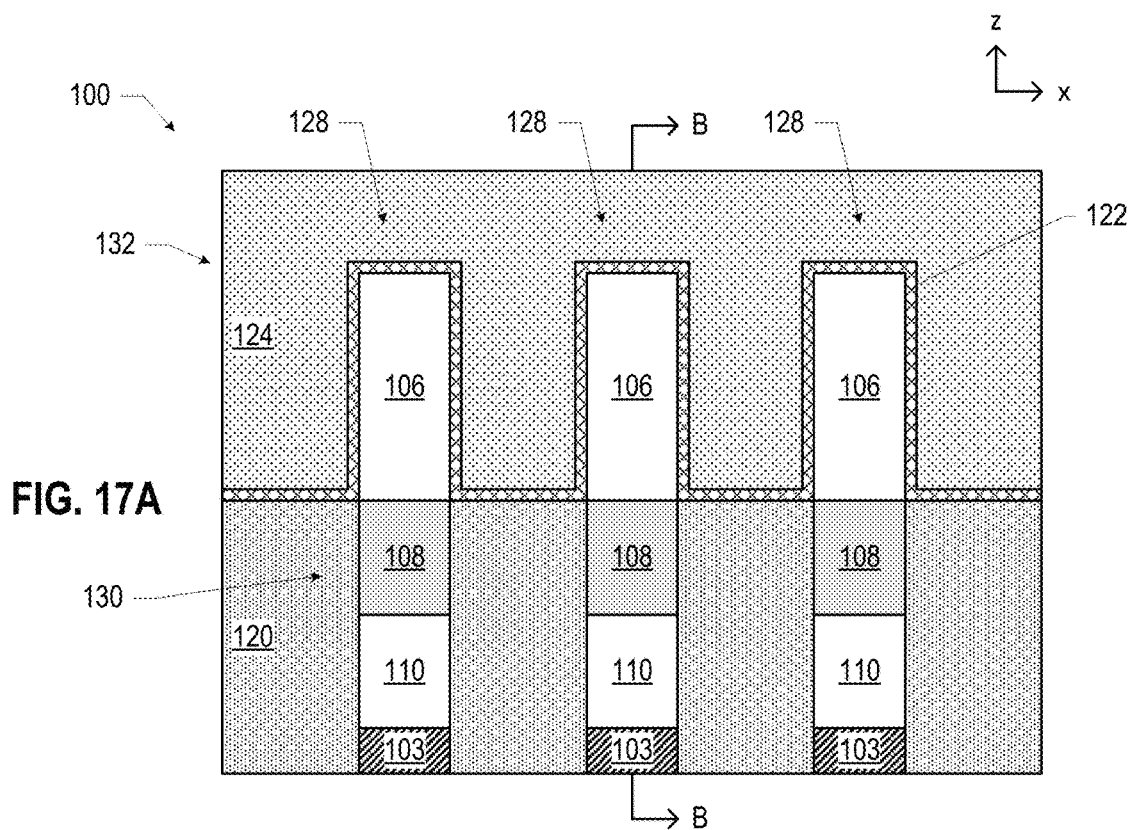
Figure 17B:
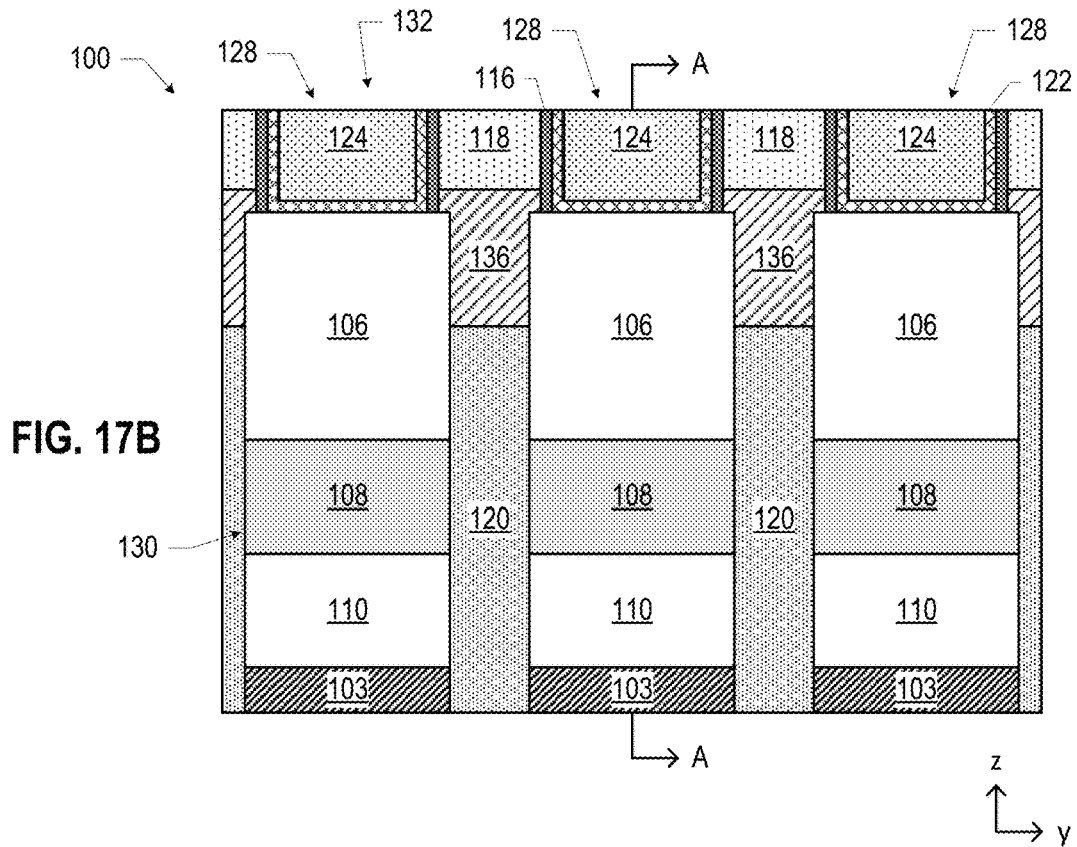
Figure 18A:
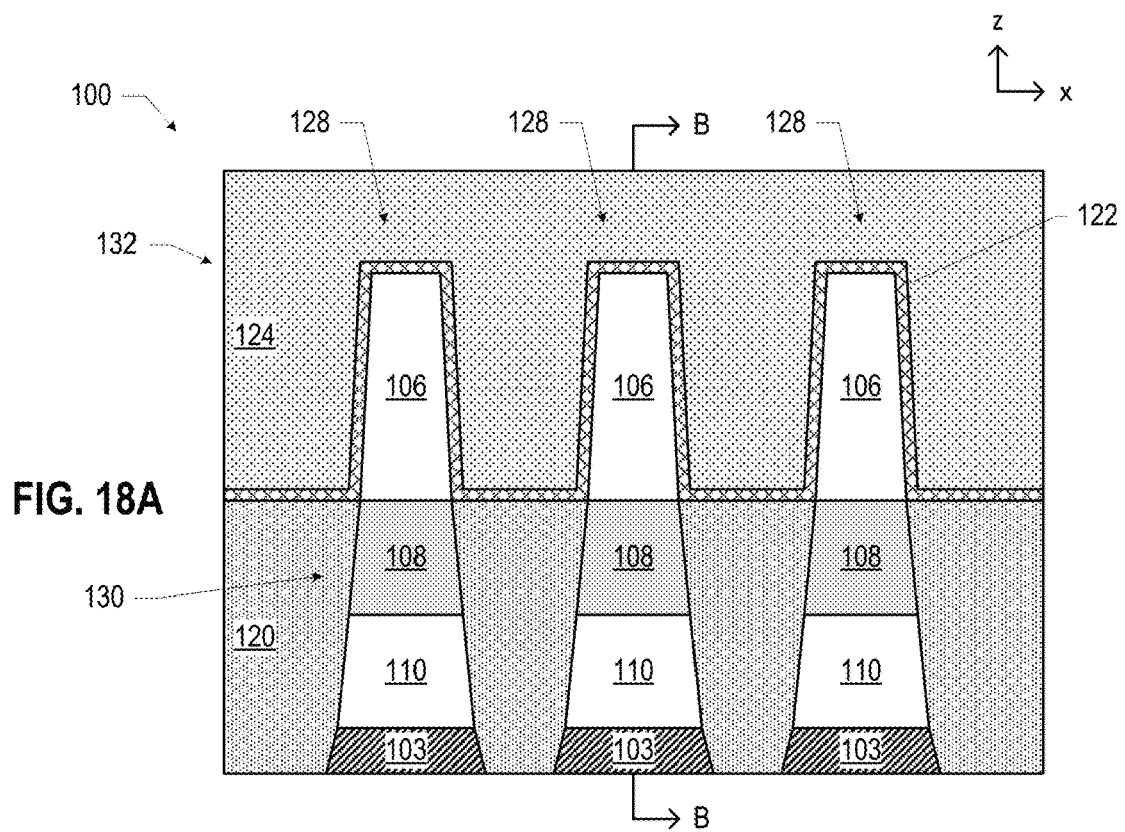
Figure 18B:
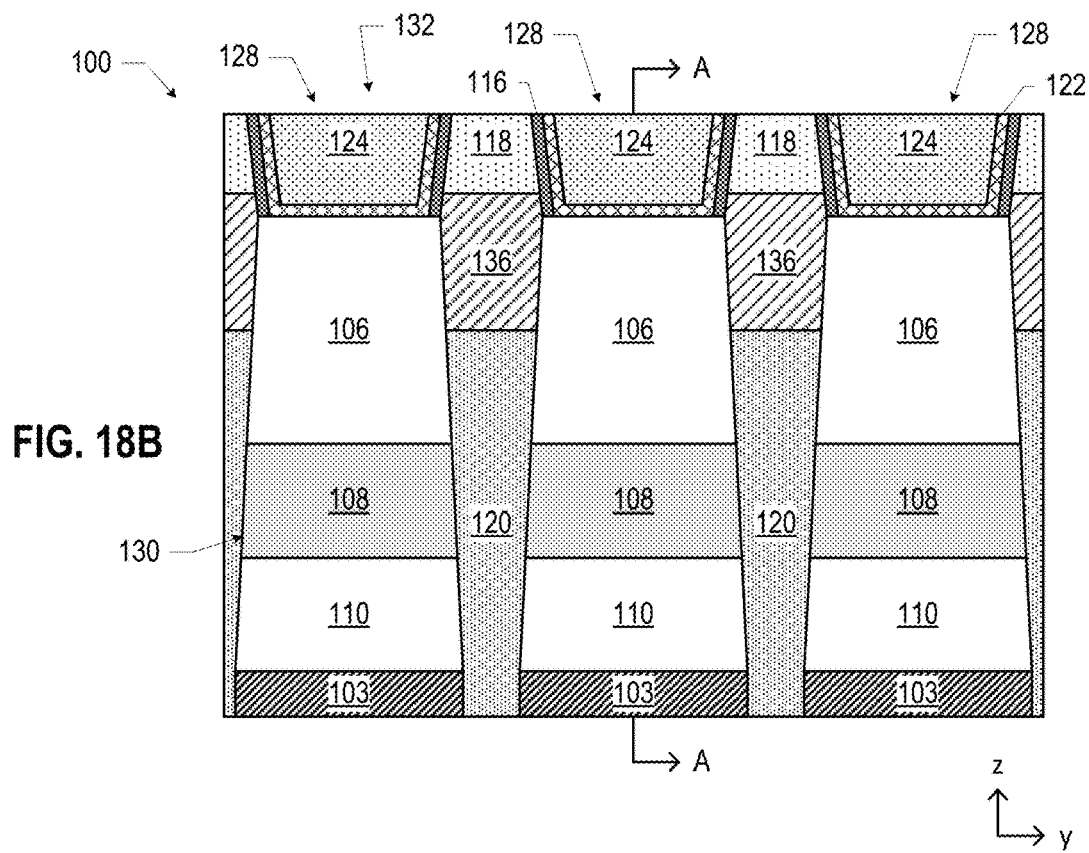

FIGS. 16-18 illustrate additional example IC structures 100. Any of the features discussed with reference to any of FIGS. 1 and 16-18 herein may be combined with any other features to form an IC structure 100. For example, as discussed further below, FIG. 16 illustrates an embodiment in which the gate dielectric 122 selectively forms on the channel region 106, and FIG. 17 illustrates an embodiment in which the channel region 106 extends into the S/D regions 136. These features of FIGS. 16 and 17 may be combined so that an IC structure 100, in accordance with the present disclosure, includes a gate dielectric 122 selectively on the channel region 106 and the channel region 106 extends into the S/D regions 136. This particular combination is simply an example, and any combination may be used. A number of elements of FIG. 1 are shared with FIGS. 16-18; for ease of discussion, a description of these elements is not repeated, and these elements may take the form of any of the embodiments disclosed herein.

FIG. 16 illustrates an IC structure 100 in which no gate dielectric 122 is present on the "horizontal" surfaces of the dielectric material 120. As discussed above with reference to FIG. 12, such an IC structure 100 may be manufactured by selecting a gate dielectric 122 and a deposition technique that allows the gate dielectric 122 to selectively deposit on the channel region 106 without also depositing on the dielectric material 120.

FIG. 17 illustrates an IC structure 100 in which the channel region 106 is not "trimmed" to be flush with the outer surface of the spacers 116 (as discussed above with reference to FIG. 7), but instead extends into the S/D regions 136.

As noted above, the IC structures 100 depicted in various ones of the accompanying drawings are shown as having precise rectilinear features, but this is simply for ease of illustration, and devices manufactured using practical manufacturing processes deviate from rectilinearity. FIG. 18 is a depiction of the IC structure 100 of FIG. 1 that includes some of the tapering that may occur when the IC structure 100 is practically manufactured; further deviations may incur rounding, uneven surfaces, or other nonidealities. In the particular example of FIG. 18, the fin 130 may widen toward its "bottom," resulting in a channel region 106 that is narrower than the contact region 110.

The IC structures 100 disclosed herein may be included in any suitable electronic component. FIGS. 19-23 illustrate various examples of apparatuses that may include any of the IC structures 100 disclosed herein.

Figure 19:
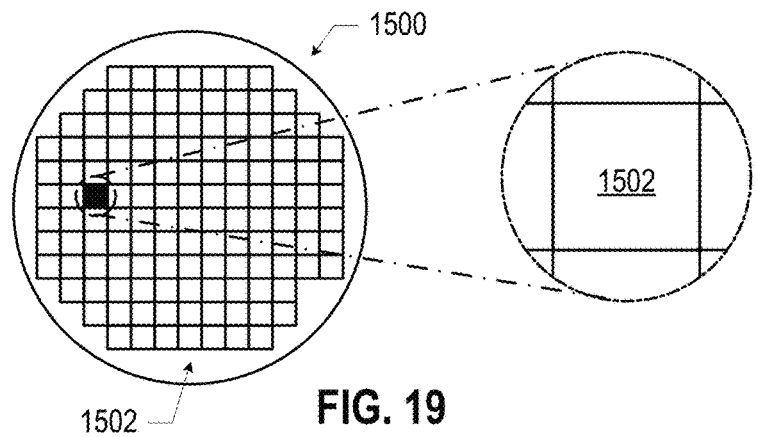
FIG. 19 is a top view of a wafer and dies that may include any of the IC structures disclosed herein, in accordance with any of the embodiments disclosed herein.

FIG. 19 is a top view of a wafer 1500 and dies 1502 that may include one or more IC structures 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., as discussed below with reference to FIG. 20), one or more transistors (e.g., some of the transistors of the device region 1604 of FIG. 20, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 23) or other logic that is configured to store information in the memory devices or execute instructions stored in the memory array.

Figure 20:
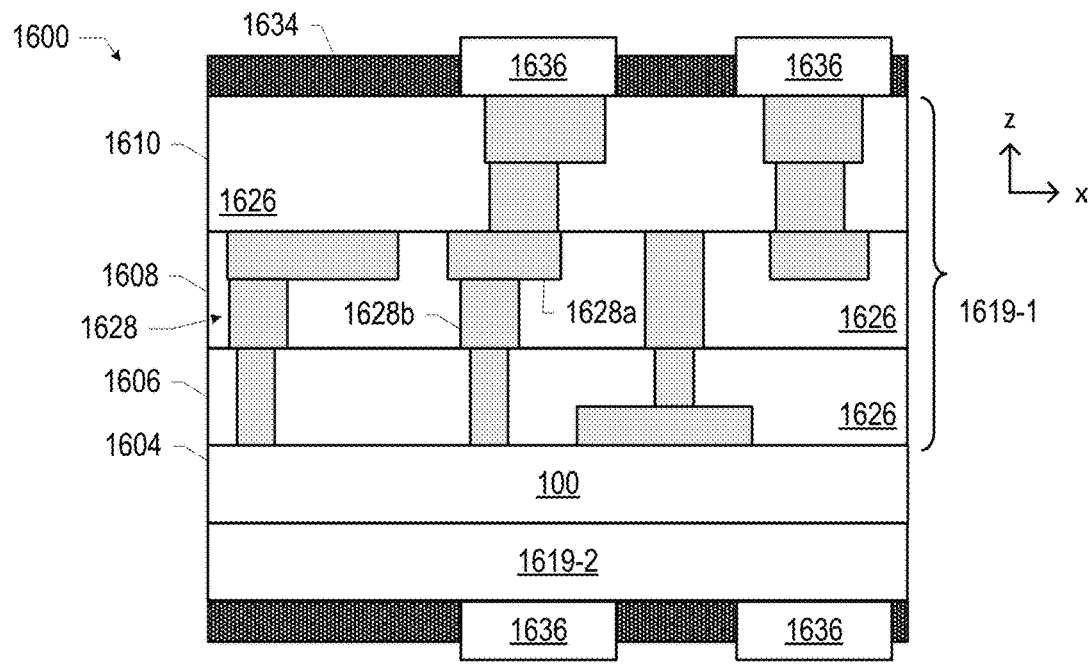
FIG. 20 is a side, cross-sectional view of an IC device that may include any of the IC structures disclosed herein, in accordance with any of the embodiments disclosed herein.

FIG. 20 is a side, cross-sectional view of an IC device 1600 that may include one or more IC structures 100 in accordance with any of the embodiments disclosed herein. One or more of the IC devices 1600 may be included in one or more dies 1502 (FIG. 19).

The IC device 1600 may include a device region 1604 including any of the IC structures 100 disclosed herein, as well as other types of transistor or devices, as desired. For example, one or more regions of the device region 1604 may include the IC structures 100 disclosed herein, and other regions of the device region 1604 may include planar transistors (e.g., BJTs, heterojunction bipolar transistors (HBT), or high-electron-mobility transistors (HEMT)) or non-planar transistors (e.g., double-gate transistors, tri-gate transistors, or wrap-around or all-around gate transistors such as nanoribbon and nanowire transistors). The device region 1604 may further include electrical contacts to the gates of the transistors included in the device region 1604 (e.g., to the gate stack 124 of the IC structures 100) and to the S/D regions of the transistors included in the device region 1604 (e.g., S/D contacts 118 to the S/D regions 136 of the IC structures 100).

Electrical signals, such as power and/or input/output (I/O) signals, may be routed to and/or from the devices (e.g., the PNBTFETs 128) of the device region 1604 through one or more interconnect layers disposed on the device region 1604 (illustrated in FIG. 20 as interconnect layers 1606-1610). For example, electrically conductive features of the device region 1604 (e.g., the gate stack 124 and the S/D contacts 118) may be electrically coupled with the interconnect structures 1628 of the interconnect layers 1606-1610. The one or more interconnect layers 1606-1610 may form a metallization stack (also referred to as an "ILD stack") 1619-1 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 20). Although a particular number of interconnect layers 1606-1610 is depicted in FIG. 20, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in the x-y plane, perpendicular to the z-orientation of the "stack" of the contact region 110, the intermediate region 108, and the channel region 106. For example, the lines 1628a may route electrical signals in a direction in and out of the page from the perspective of FIG. 20. The vias 1628b may be arranged to route electrical signals in a direction of a plane that is substantially perpendicular to the surface of the base 102 upon which the device region 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 20. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device region 1604. In some embodiments, the first interconnect layer 1606 may include lines 1628a and/or vias 1628b, as shown. The lines 1628a of the first interconnect layer 1606 may be coupled with contacts (e.g., the S/D contacts 118 or the gate contacts, not shown) of the device region 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device region 1604) may be thicker.

The IC device 1600 may include a solder resist material 1634 (e.g., polyimide or similar material) and one or more conductive contacts 1636 formed on the interconnect layers 1606-1610. In FIG. 20, the conductive contacts 1636 are illustrated as taking the form of bond pads. The conductive contacts 1636 may be electrically coupled with the interconnect structures 1628 and configured to route the electrical signals of the transistor(s) of the device region 1604 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

The IC device 1600 may further include another metallization stack 1619-2 on the "backside" of the IC structure 100. The metallization stack 1619-2 may include any of the structures discussed above with reference to the metallization stack 1619-1, and conductive pathways in the metallization stack 1619-2 may make electrical contact with the body contacts 103 of the PNBTFETs 128 of the IC structure 100. In some embodiments, another set of conductive contacts 1636 may be disposed on the metallization stack 1619-2, resulting in a "double-sided" IC device 1600. In other embodiments, the metallization stack 1619-2 may be present, but conductive contacts 1636 may only be disposed on the metallization stack 1619-1. Generally, the orientation of the "stack" formed by the contact region 110, the intermediate region 108, and the channel region 106 may be perpendicular to the orientation of the interconnect layers of the metallization stack(s) 1619.

Figure 21:
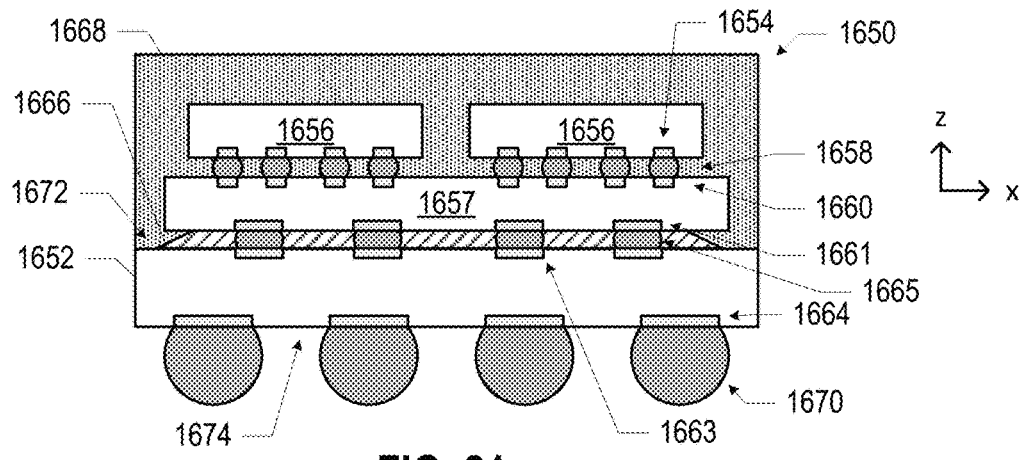
FIG. 21 is a side, cross-sectional view of an IC package that may include any of the IC structures disclosed herein, in accordance with various embodiments.

FIG. 21 is a side, cross-sectional view of an example IC package 1650 that may include one or more IC structures 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 20.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 21 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 21 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 21 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 22.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 21 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 21, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 22:
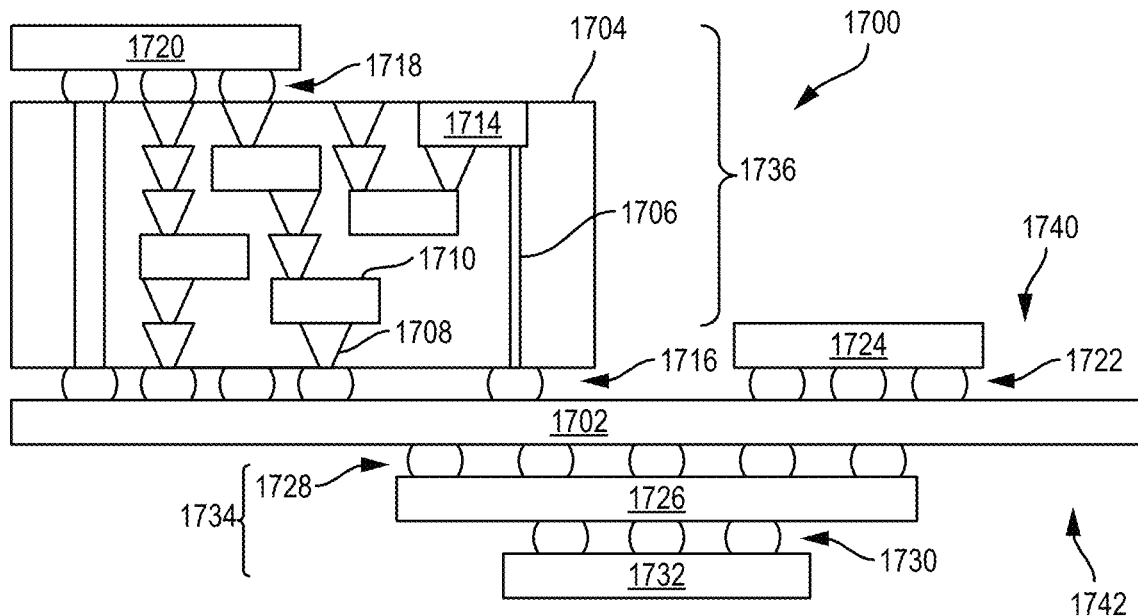
FIG. 22 is a side, cross-sectional view of an IC device assembly that may include any of the IC structures disclosed herein, in accordance with any of the embodiments disclosed herein.

FIG. 22 is a side, cross-sectional view of an IC device assembly 1700 that may include one or more IC packages or other electronic components (e.g., a die) including one or more IC structures 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 21 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 22 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 22), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 22, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 19), an IC device (e.g., the IC device 1600 of FIG. 20), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 22, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 22 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 23:
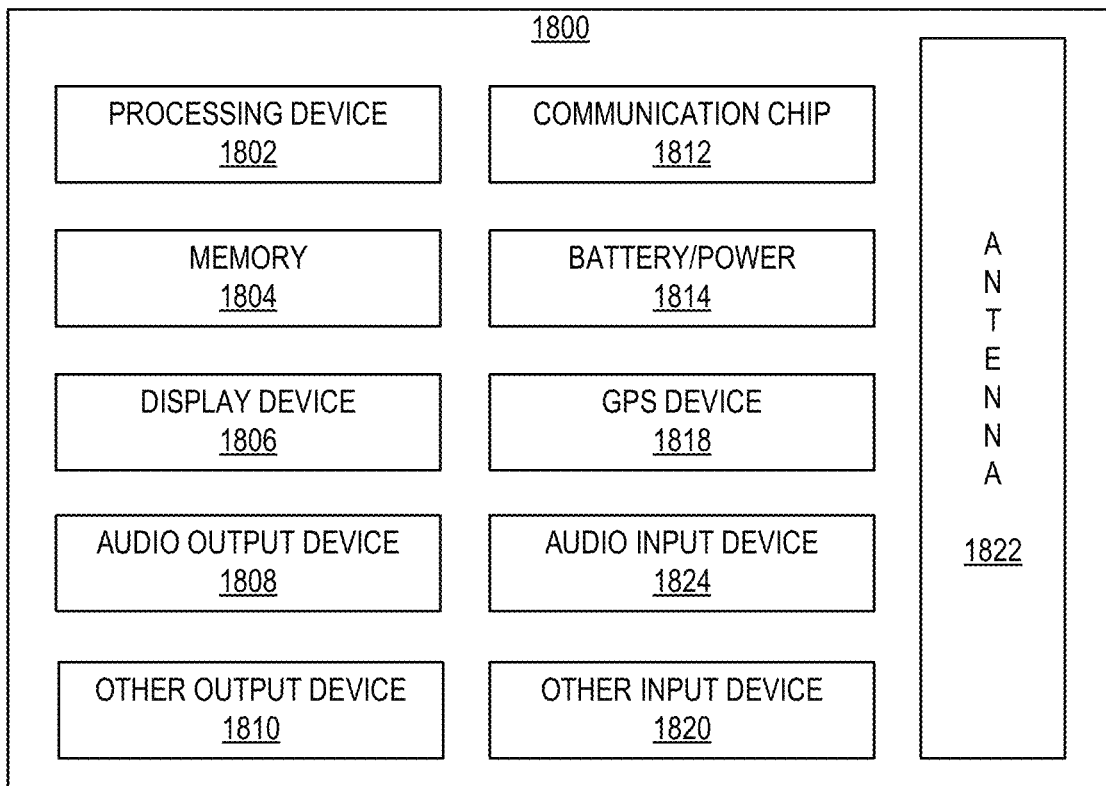
FIG. 23 is a block diagram of an example electrical device that may include any of the IC structures disclosed herein, in accordance with any of the embodiments disclosed herein.

FIG. 23 is a block diagram of an example electrical device 1800 that may include one or more IC structures 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 23 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 23, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a fin including a channel region, a contact region, and an intermediate region between the contact region and the channel region, wherein the channel region includes a dopant of a first type, the intermediate region includes a dopant of a second type different from the first type, and the contact region includes a dopant of the first type; a gate that at least partially wraps around the channel region; and a conductive contact in contact with the contact region.

Example 2 includes the subject matter of Example 1, and further specifies that the channel region is in a top portion of the fin, and the contact region is in a bottom portion of the fin.

Example 3 includes the subject matter of any of Examples 1-2, and further specifies that the first type is a p-type and the second type is an n-type.

Example 4 includes the subject matter of any of Examples 1-2, and further specifies that the first type is an n-type and the second type is a p-type.

Example 5 includes the subject matter of any of Examples 1-4, and further specifies that a dopant level in the contact region is greater than a dopant level in the channel region.

Example 6 includes the subject matter of any of Examples 1-5, and further specifies that a dopant level in the contact region is greater than a dopant level in the channel region by at least two orders of magnitude.

Example 7 includes the subject matter of any of Examples 1-6, and further includes: source/drain (S/D) regions proximate to the channel region, wherein the S/D regions include a dopant of the second type.

Example 8 includes the subject matter of any of Examples 1-7, and further specifies that the contact region is between the conductive contact and the intermediate region.

Example 9 includes the subject matter of any of Examples 1-8, and further includes: a dielectric material on side faces of the fin; wherein the gate contacts the dielectric material.

Example 10 includes the subject matter of any of Examples 1-9, and further specifies that the fin is narrower proximate to the channel region and wider proximate to the contact region.

Example 11 includes the subject matter of any of Examples 1-10, and further specifies that the gate contacts side faces of the fin.

Example 12 includes the subject matter of any of Examples 1-11, and further specifies that the gate includes a gate stack and a gate dielectric between the channel region and the gate stack.

Example 13 includes the subject matter of Example 12, and further specifies that the gate stack includes one or more metals.

Example 14 includes the subject matter of any of Examples 1-13, and further specifies that a height of the channel region is less than 100 nanometers.

Example 15 includes the subject matter of any of Examples 1-14, and further specifies that a height of the intermediate region is between 20 nanometers and 100 nanometers.

Example 16 includes the subject matter of any of Examples 1-15, and further specifies that a height of the contact region is between 20 nanometers and 100 nanometers.

Example 17 is an integrated circuit (IC) die, including: a transistor including a channel region, a contact region, and an intermediate region, wherein the channel region is above the contact region and the contact region is above the intermediate region, the channel region includes a dopant of a first type, the intermediate region includes a dopant of a second type different from the first type, and the contact region includes a dopant of the first type, and a gate, wherein the channel region is between the gate and the intermediate region.

Example 18 includes the subject matter of Example 17, and further specifies that the first type is a p-type and the second type is an n-type.

Example 19 includes the subject matter of Example 17, and further specifies that the first type is an n-type and the second type is a p-type.

Example 20 includes the subject matter of any of Examples 17-19, and further specifies that a dopant level in the contact region is greater than a dopant level in the channel region.

Example 21 includes the subject matter of any of Examples 17-20, and further specifies that a dopant level in the contact region is greater than a dopant level in the channel region by at least two orders of magnitude.

Example 22 includes the subject matter of any of Examples 17-21, and further specifies that the gate that at least partially wraps around the channel region.

Example 23 includes the subject matter of any of Examples 17-22, and further includes: a dielectric material on side faces of the contact region; wherein the gate contacts the dielectric material.

Example 24 includes the subject matter of any of Examples 17-23, and further specifies that the gate contacts side faces of the channel region.

Example 25 includes the subject matter of any of Examples 17-24, and further specifies that the gate includes a gate stack and a gate dielectric between the channel region and the gate stack.

Example 26 includes the subject matter of Example 25, and further specifies that the gate stack includes one or more metals.

Example 27 includes the subject matter of any of Examples 17-26, and further includes: one or more layers of metallization in electrical contact with the gate.

Example 28 includes the subject matter of any of Examples 17-27, and further specifies that the transistor further includes: a conductive contact in contact with the contact region.

Example 29 includes the subject matter of Example 28, and further specifies that the contact region is between the conductive contact and the intermediate region.

Example 30 includes the subject matter of any of Examples 28-29, and further includes: one or more layers of metallization in electrical contact with the conductive contact.

Example 31 includes the subject matter of any of Examples 17-30, and further specifies that the transistor further includes: source/drain (S/D) regions proximate to the channel region, wherein the S/D regions include a dopant of the second type.

Example 32 includes the subject matter of Example 31, and further specifies that the S/D regions have a crystalline structure.

Example 33 includes the subject matter of any of Examples 31-32, and further includes: one or more layers of metallization in electrical contact with the S/D regions.

Example 34 includes the subject matter of any of Examples 17-33, and further specifies that the channel region is narrower than the contact region.

Example 35 includes the subject matter of any of Examples 17-34, and further specifies that a height of the channel region is less than 100 nanometers.

Example 36 includes the subject matter of any of Examples 17-35, and further specifies that a height of the intermediate region is between 20 nanometers and 100 nanometers.

Example 37 includes the subject matter of any of Examples 17-36, and further specifies that a height of the contact region is between 20 nanometers and 100 nanometers.

Example 38 is a computing device, including: a circuit board; and an integrated circuit (IC) package coupled to the circuit board, wherein the IC package includes an IC die, the IC die includes a transistor that has a gate, a channel region, and a contact region, and the channel region is between the gate and the contact region.

Example 39 includes the subject matter of Example 38, and further specifies that the IC package includes a package substrate, and the IC die is coupled to the package substrate.

Example 40 includes the subject matter of any of Examples 38-39, and further specifies that the transistor further includes an intermediate region between the channel region and the contact region.

Example 41 includes the subject matter of Example 40, and further specifies that the channel region includes a dopant of a first type, the intermediate region includes a dopant of a second type different from the first type, and the contact region includes a dopant of the first type.

Example 42 includes the subject matter of Example 41, and further specifies that the first type is a p-type and the second type is an n-type.

Example 43 includes the subject matter of Example 41, and further specifies that the first type is an n-type and the second type is a p-type.

Example 44 includes the subject matter of any of Examples 41-43, and further specifies that a dopant level in the contact region is greater than a dopant level in the channel region.

Example 45 includes the subject matter of any of Examples 41-44, and further specifies that a dopant level in the contact region is greater than a dopant level in the channel region by at least two orders of magnitude.

Example 46 includes the subject matter of any of Examples 38-45, and further specifies that the gate that at least partially wraps around the channel region.

Example 47 includes the subject matter of any of Examples 38-46, and further specifies that the IC die further includes: a dielectric material on side faces of the contact region; wherein the gate contacts the dielectric material.

Example 48 includes the subject matter of any of Examples 38-47, and further specifies that the gate contacts side faces of the channel region.

Example 49 includes the subject matter of any of Examples 38-48, and further specifies that the gate includes a gate stack and a gate dielectric between the channel region and the gate stack.

Example 50 includes the subject matter of Example 49, and further specifies that the gate stack includes one or more metals.

Example 51 includes the subject matter of any of Examples 38-50, and further specifies that the IC die further includes: one or more layers of metallization in electrical contact with the gate.

Example 52 includes the subject matter of any of Examples 38-51, and further specifies that the IC die further includes: a conductive contact in contact with the contact region.

Example 53 includes the subject matter of Example 52, and further specifies that the contact region is between the conductive contact and the channel region.

Example 54 includes the subject matter of any of Examples 52-53, and further specifies that the IC die further includes: one or more layers of metallization in electrical contact with the conductive contact.

Example 55 includes the subject matter of any of Examples 38-54, and further specifies that the IC die further includes: source/drain (S/D) regions proximate to the channel region, wherein the S/D regions include a dopant of the second type.

Example 56 includes the subject matter of Example 55, and further specifies that the S/D regions have a crystalline structure.

Example 57 includes the subject matter of any of Examples 55-56, and further specifies that the IC die further includes: one or more layers of metallization in electrical contact with the S/D regions.

Example 58 includes the subject matter of any of Examples 38-57, and further specifies that the channel region is narrower than the contact region.

Example 59 includes the subject matter of any of Examples 38-58, and further specifies that a height of the channel region is less than 100 nanometers.

Example 60 includes the subject matter of any of Examples 38-59, and further specifies that a height of the intermediate region is between 20 nanometers and 100 nanometers.

Example 61 includes the subject matter of any of Examples 38-60, and further specifies that a height of the contact region is between 20 nanometers and 100 nanometers.

Example 62 includes the subject matter of any of Examples 38-61, and further specifies that the circuit board is a motherboard.

Example 63 includes the subject matter of any of Examples 38-62, and further includes: wireless communication circuitry electrically coupled to the circuit board.

Example 64 includes the subject matter of any of Examples 38-63, and further includes: a display electrically coupled to the circuit board.

Example 65 includes the subject matter of any of Examples 38-64, and further specifies that the computing device is a tablet computing device, a handheld computing device, a smart phone, a wearable computing device, or a server.

Example 66 is a method of manufacturing an integrated circuit (IC) structure, including performing any of the manufacturing operations disclosed herein.

The invention claimed is:

1. An integrated circuit (IC) structure, comprising:
a fin including a channel region, a contact region, and an intermediate region between the contact region and the channel region, wherein the channel region includes a dopant of a first type, the intermediate region includes a dopant of a second type different from the first type, and the contact region includes a dopant of the first type;
a gate that at least partially wraps around the channel region; and
a conductive contact in contact with the contact region, wherein sidewalls of the intermediate region are in contact with an insulator material, sidewalls of the conductive contact are in contact with the insulator material, and sidewalls of the contact region are in contact with the insulator material.

2. The IC structure of claim 1, wherein the channel region is in a top portion of the fin, and the contact region is in a bottom portion of the fin.

3. The IC structure of claim 1, wherein the first type is a p-type and the second type is an n-type, or the first type is an n-type and the second type is a p-type.

4. The IC structure of claim 1, wherein a dopant level in the contact region is greater than a dopant level in the channel region.

5. The IC structure of claim 1, wherein a dopant level in the contact region is greater than a dopant level in the channel region by at least two orders of magnitude.

6. The IC structure of claim 1, further comprising:
source or regions adjacent to the channel region, wherein the source or drain regions include a dopant of the second type.

7. The IC structure of claim 1, wherein the insulator material in contact with the sidewalls of the intermediate region is materially continuous with the insulator material in contact with the sidewalls of the contact region.

8. The IC structure of claim 1, wherein the insulator material in contact with the sidewalls of the intermediate region is materially continuous with the insulator material in contact with the sidewalls of the contact region and with the insulator material in contact with the sidewalls of the conductive contact.

9. The IC structure of claim 1, wherein the channel region is in contact with the intermediate region.

10. The IC structure of claim 1, wherein the intermediate region is in direct physical contact with either the contact region or the channel region.

11. An integrated circuit (IC) structure, comprising:
a first fin including a first channel region, a first contact region, and a first intermediate region between the first contact region and the first channel region, wherein the first channel region includes a dopant of a first type, the first intermediate region includes a dopant of a second type different from the first type, and the first contact region includes a dopant of the first type;
a first conductive contact in contact with the first contact region;
a second fin including a second channel region, a second contact region, and a second intermediate region between the second contact region and the second channel region, wherein the second channel region includes a dopant of the first type, the second intermediate region includes a dopant of the second type, and the second contact region includes a dopant of the first type;
a second conductive contact in contact with the second contact region;
a gate that at least partially wraps around the first channel region; and
an insulator material extending between, and being in contact with, the first intermediate region and the second intermediate region.

12. The IC structure of claim 11, wherein the gate further at least partially wraps around the second channel region.

13. The IC structure of claim 11, wherein:
the first intermediate region has a sidewall facing the second intermediate region,
the second intermediate region has a sidewall facing the first intermediate region, and
the insulator material fills a volume defined by the sidewall of the first intermediate region and the sidewall of the second intermediate region.

14. The IC structure of claim 11, wherein the insulator material is further extending between, and is in contact with, the first contact region and the second contact region.

15. The IC structure of claim 14, wherein the insulator material is further extending between, and is in contact with, the first conductive contact and the second conductive contact.

16. The IC structure of claim 11, wherein the insulator material is a part of an insulator structure, and wherein the insulator structure is a materially continuous structure of the insulator material having portions in contact with the first contact region, the second contact region, the first conductive contact, and the second conductive contact.

17. An integrated circuit (IC) structure, comprising: a fin including a channel region, a contact region, and an intermediate region between the contact region and the channel region, wherein the intermediate region is in direct physical contact with the contact region, the channel region includes a dopant of a first type, the intermediate region includes a dopant of a second type different from the first type, and the contact region includes a dopant of the first type; a gate that at least partially wraps around the channel region; and a conductive contact in contact with the contact region, wherein no gate wraps around sidewalls of the intermediate region.

18. The IC structure of claim 17, wherein sidewalls of the intermediate region and sidewalls of the contact region are in contact with an insulator material.

19. The IC structure of claim 17, wherein sidewalls of the intermediate region are in contact with an insulator material, sidewalls of the conductive contact are in contact with the insulator material, and sidewalls of the contact region are in contact with the insulator material.

20. The IC structure of claim 17, wherein sidewalls of the intermediate region are in contact with an insulator material, sidewalls of the contact region are in contact with the insulator material, and the insulator material in contact with the sidewalls of the intermediate region is materially continuous with the insulator material in contact with the sidewalls of the contact region.

21. A computing device, comprising:
a circuit board; and
an integrated circuit (IC) package coupled to the circuit board, wherein:
the IC package includes an IC die,
the IC die includes:
a fin including a channel region, a contact region, and an intermediate region between the contact region and the channel region, wherein the channel region includes a dopant of a first type, the intermediate region includes a dopant of a second type different from the first type, and the contact region includes a dopant of the first type,
a gate that at least partially wraps around the channel region, and
a conductive contact in contact with the contact region, wherein sidewalls of the intermediate region are in contact with an insulator material, sidewalls of the conductive contact are in contact with the insulator material, and sidewalls of the contact region are in contact with the insulator material.

22. The computing device of claim 21, further comprising:
wireless communication circuitry electrically coupled to the circuit board.

23. The computing device of claim 21, wherein the computing device is a tablet computing device, a handheld computing device, a smart phone, a wearable computing device, or a server.

* * * * *

UNITED STATES PATENT AND TRADEMARK OFFICE
CERTIFICATE OF CORRECTION

PATENT NO. : 12,051,723 B2
APPLICATION NO. : 16/719415
DATED : July 30, 2024
INVENTOR(S) : Aaron D. Lilak et al.

It is certified that error appears in the above-identified patent and that said Letters Patent is hereby corrected as shown below:

In the Claims

In Column 24, Claim 6, Line 5, delete "source or" and insert -- source or drain --, therefor.

Signed and Sealed this
Third Day of September, 2024

*Katherine Kelly Vidal*
Katherine Kelly Vidal
*Director of the United States Patent and Trademark Office*